(12) United States Patent
Prushinskiy et al.

(10) Patent No.: US 9,711,751 B2
(45) Date of Patent: Jul. 18, 2017

(54) ORGANIC LIGHT EMITTING DISPLAY DEVICE

(71) Applicant: Samsung Display Co., Ltd., Yongin (KR)

(72) Inventors: Valeriy Prushinskiy, Hwaseong-si (KR); Min-Soo Kim, Seoul (KR); Il-Seok Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/880,475

(22) Filed: Oct. 12, 2015

(65) Prior Publication Data
US 2016/0141339 A1 May 19, 2016

(30) Foreign Application Priority Data

Nov. 18, 2014 (KR) .......................... 10-2014-0160608

(51) Int. Cl.
*H01L 51/52* (2006.01)
*H01L 27/32* (2006.01)

(52) U.S. Cl.
CPC ........ *H01L 51/5228* (2013.01); *H01L 27/326* (2013.01); *H01L 27/3218* (2013.01); *H01L 51/5203* (2013.01); *H01L 51/5225* (2013.01); *H01L 27/3213* (2013.01); *H01L 27/3258* (2013.01); *H01L 51/5234* (2013.01)

(58) Field of Classification Search
None
See application file for complete search history.

(56) References Cited

U.S. PATENT DOCUMENTS

| 9,620,613 | B2 * | 4/2017 | Park | .................... H01L 29/518 |
| 2011/0204369 | A1 * | 8/2011 | Ha | .................... H01L 51/5228 |
| | | | | 257/59 |
| 2011/0215329 | A1 | 9/2011 | Chung | |

(Continued)

FOREIGN PATENT DOCUMENTS

| KR | 10-2011-0020089 | 3/2011 |
| KR | 10-2011-0100956 | 9/2011 |
| KR | 10-2012-0055534 | 5/2012 |

OTHER PUBLICATIONS

Han, Taeseong, Dongwoo Kang, Yongmin Park, Sungjin Kim, Jang Jin Yoo, and Moojong Lim. "53.3: Structural Advantage of WRGB OLED Displays for Edge Enhancement." SID Symposium Digest of Technical Papers 45.1 (2014): 774-77.*

(Continued)

*Primary Examiner* — Joseph Schoenholtz
(74) *Attorney, Agent, or Firm* — H.C. Park & Associates, PLC

(57) ABSTRACT

An organic light emitting display device includes a substrate extending along a first direction, the substrate comprising a pixel region having a plurality of pixels and a transparent region that is located adjacent to the pixel region, a lower electrode disposed on the substrate in the pixel region, the lower electrode extending along the first direction, a light emitting layer disposed on the lower electrode, the light emitting layer extending along the first direction, and an upper electrode disposed on the light emitting layer in the pixel region, the upper electrode extending along the first direction. The upper electrode exposes the transparent region.

18 Claims, 19 Drawing Sheets

(56) References Cited

U.S. PATENT DOCUMENTS

| | | | |
|---|---|---|---|
| 2011/0220922 A1* | 9/2011 | Kim | H01L 27/326 257/88 |
| 2011/0221661 A1* | 9/2011 | Yoon | H01L 27/3272 345/76 |
| 2012/0080680 A1* | 4/2012 | Choi | H01L 27/3218 257/59 |
| 2012/0104422 A1* | 5/2012 | Lee | H01L 27/326 257/88 |
| 2012/0161616 A1 | 6/2012 | Yamagishi et al. | |
| 2012/0169683 A1* | 7/2012 | Hong | H01L 27/3211 345/206 |
| 2012/0313099 A1* | 12/2012 | Chung | H01L 27/3276 257/59 |
| 2013/0113843 A1* | 5/2013 | Yamazaki | H01L 27/326 345/690 |
| 2013/0313539 A1* | 11/2013 | Ha | H01L 27/322 257/40 |
| 2013/0328022 A1* | 12/2013 | Choi | H01L 51/5008 257/40 |
| 2014/0110681 A1 | 4/2014 | Hack et al. | |
| 2014/0225815 A1 | 8/2014 | Jung et al. | |
| 2014/0231761 A1* | 8/2014 | Kim | H01L 22/12 257/40 |
| 2015/0200236 A1 | 7/2015 | Kim et al. | |
| 2016/0276619 A1* | 9/2016 | Cheng | H01L 51/56 |

OTHER PUBLICATIONS

Frontline Technolgoy RGB Color Patterning for AMOLED TVs, SID Information Display Mar.-Apr. 2013.*

European Search Report issued on Apr. 21, 2016, in European Patent Application No. 15187585.3.

* cited by examiner

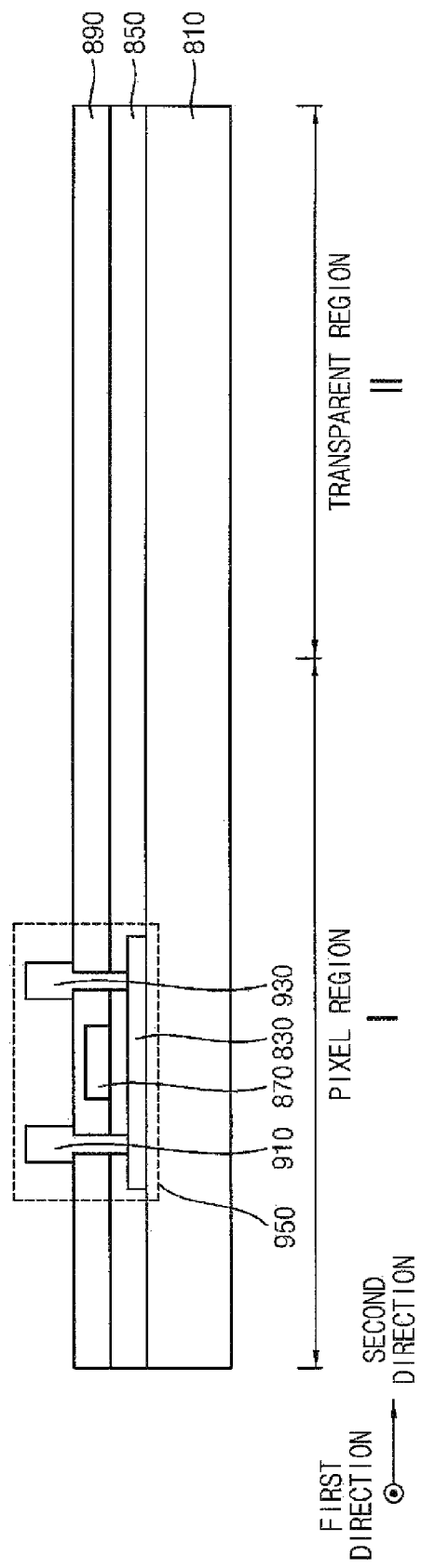

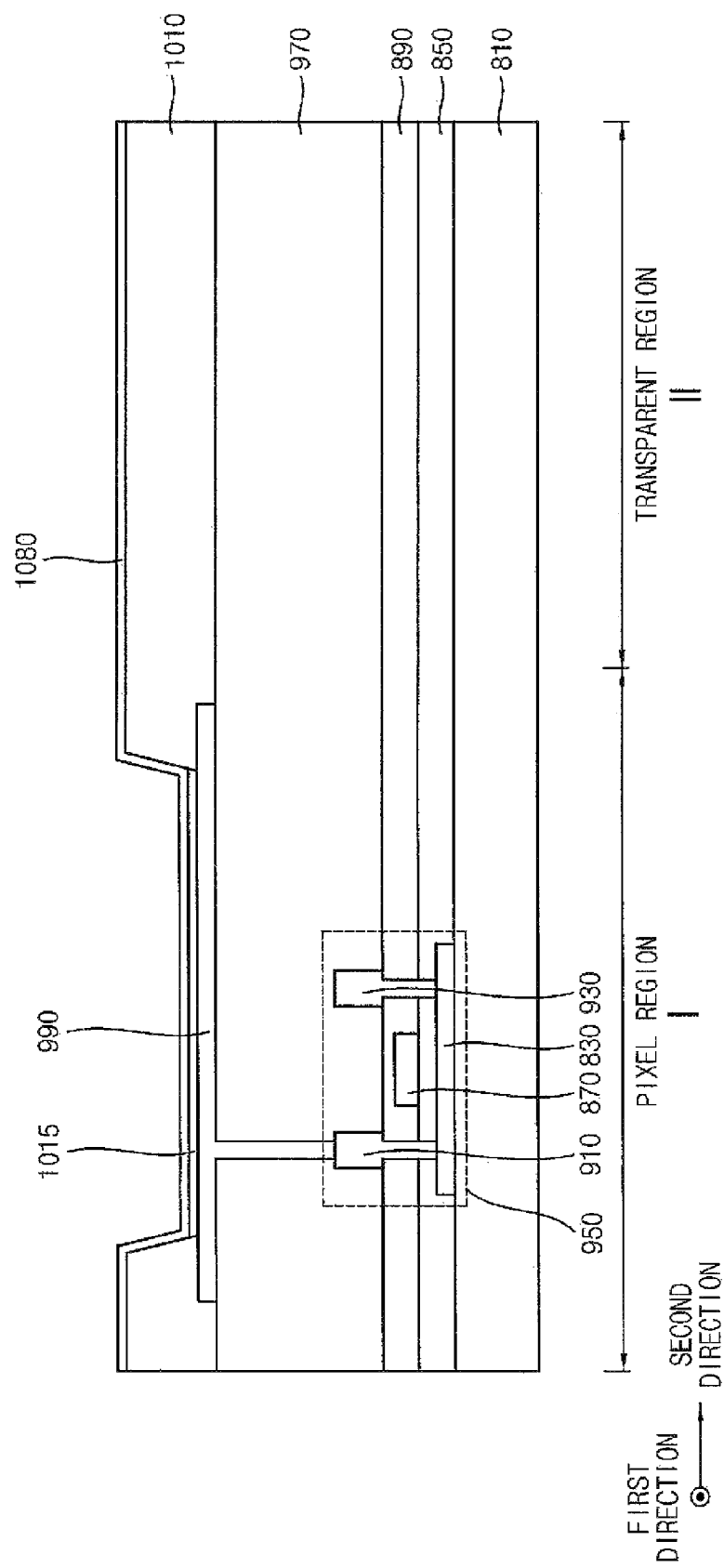

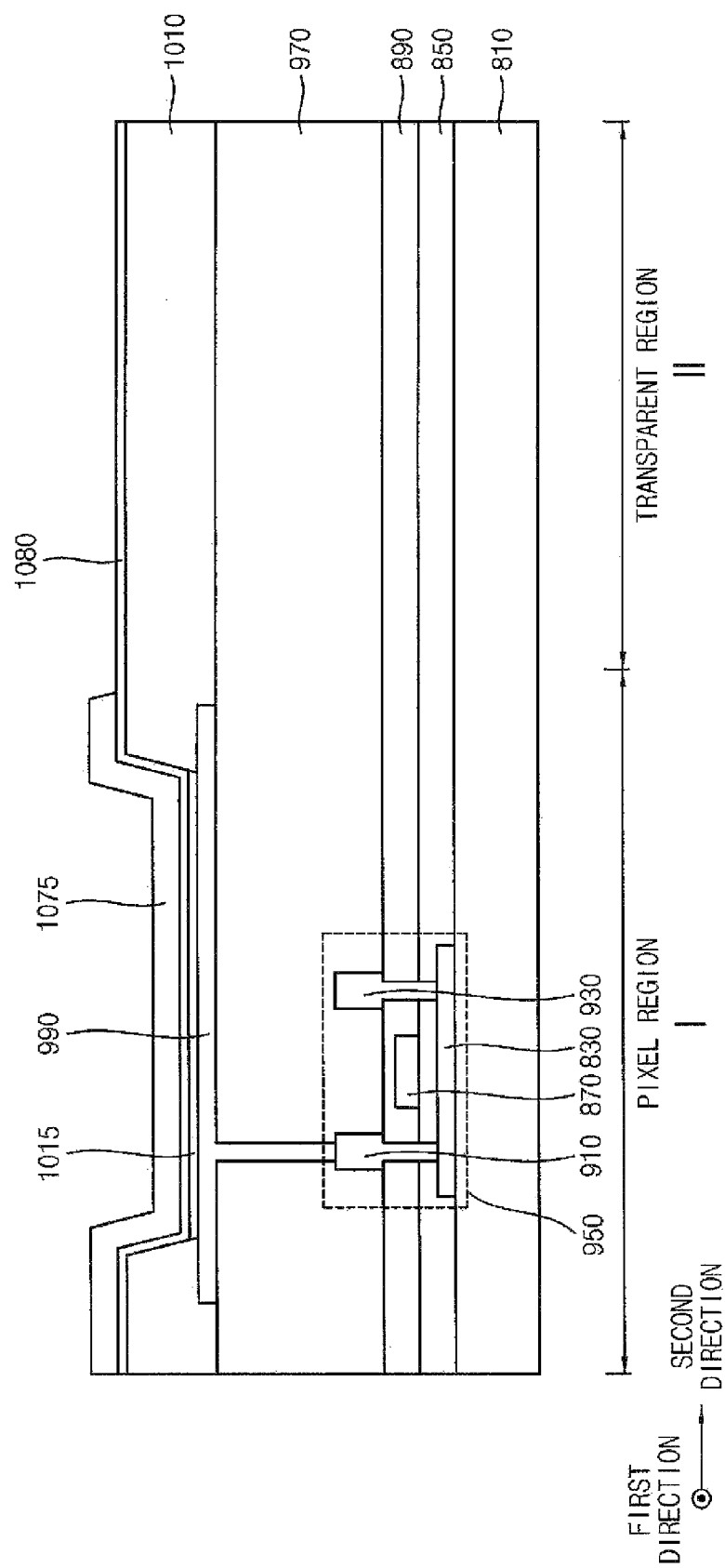

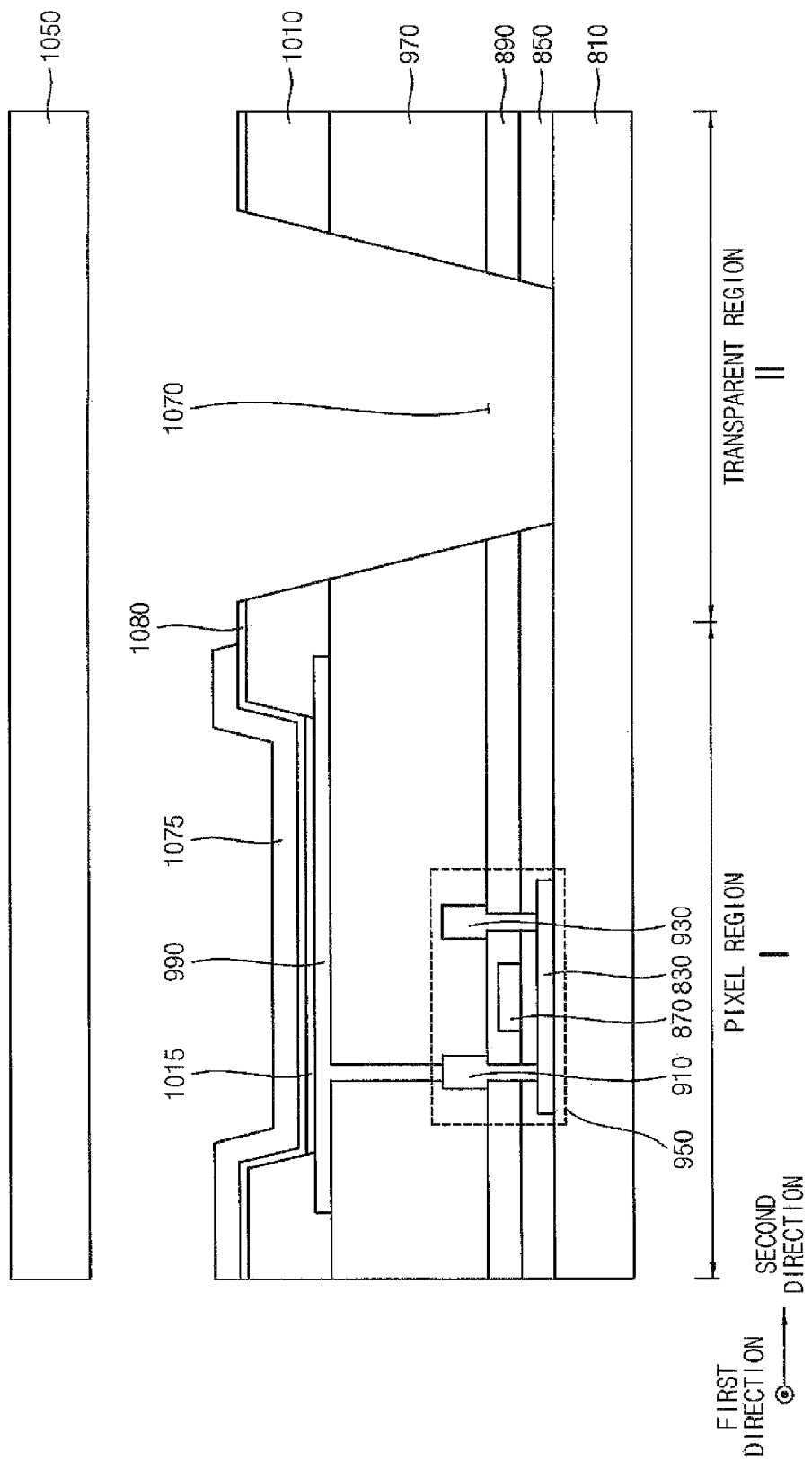

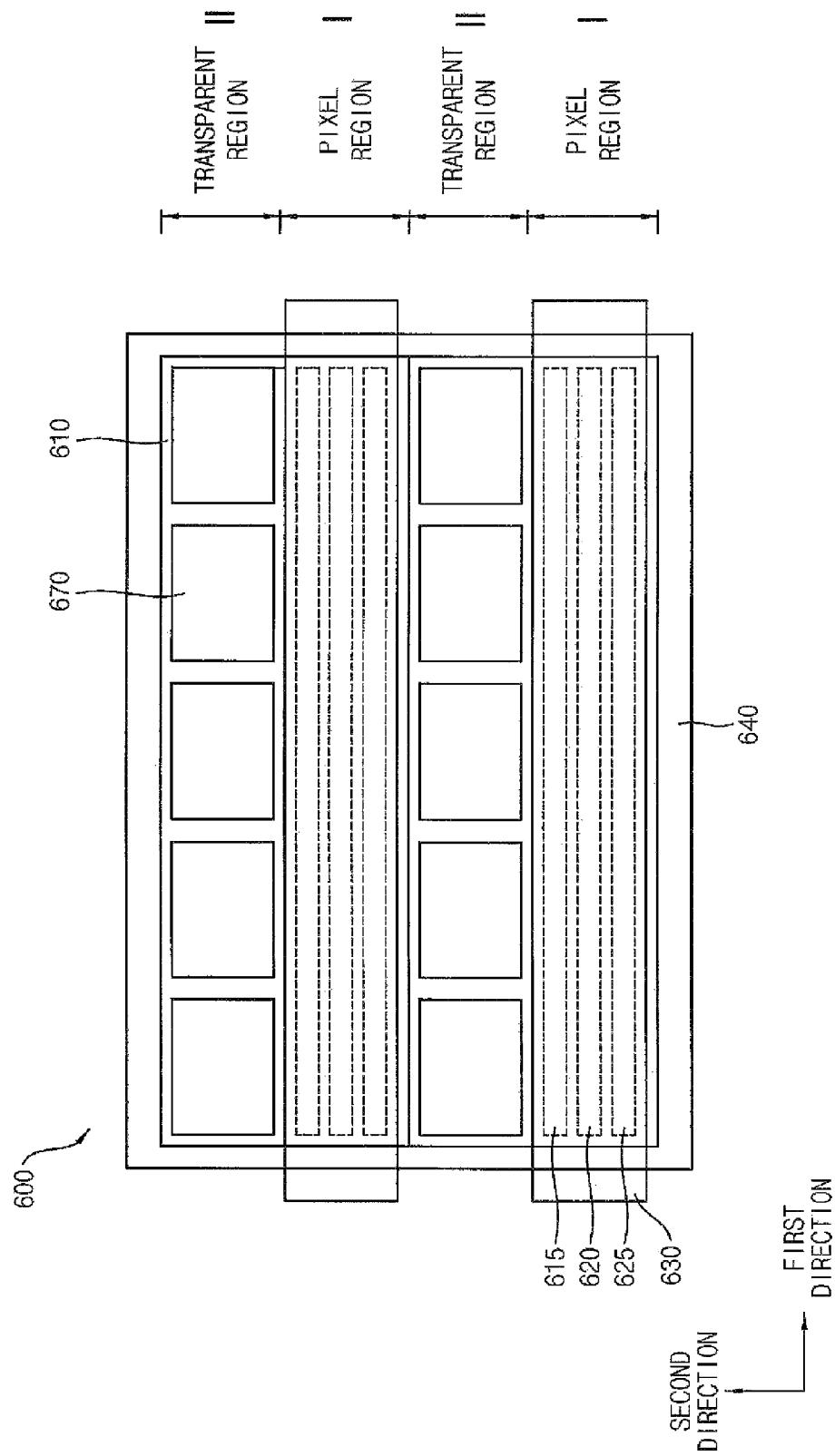

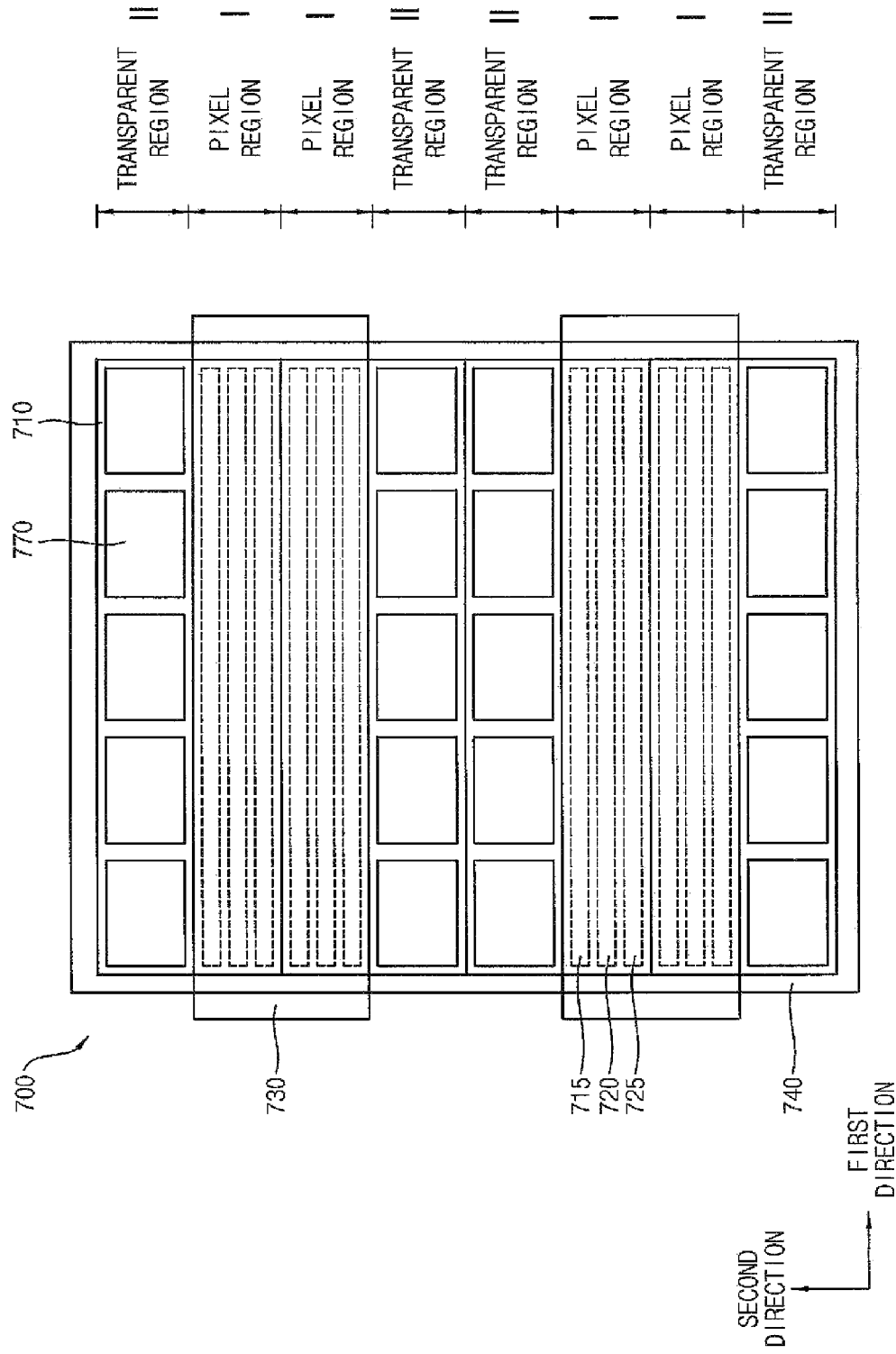

ORGANIC LIGHT EMITTING DISPLAY DEVICE

CROSS-REFERENCE TO RELATED APPLICATION(S)

This application claims priority from and the benefit of Korean Patent Application No. 10-2014-0160608, filed on Nov. 18, 2014, which is incorporated by reference for all purposes as if set forth herein.

BACKGROUND

Exemplary embodiments relate generally to organic light emitting display devices. More particularly, exemplary embodiments relate to organic light emitting display devices including a pixel region and a transparent region.

A flat panel display (FPD) device is widely used as a display device of an electronic device because the FPD device is lightweight and thin compared to cathode-ray tube (CRT) display devices. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, a transparent OLED device has been developed that is capable of transmitting an image of an object (or target) that is located in the rear (or at the back) of the OLED device by including a transparent region and a pixel region. In this case, a transmissivity of a light incident into the transparent region may be decreased by a cathode electrode located in the transparent region. In addition, an IR drop (i.e., voltage drop) may be generated because the cathode electrode is thin. Thus, a definition (e.g., visibility) of the image of the object that is located in the rear of a conventional OLED device may be reduced due to the decrease of the transmissivity, and a uniform luminance may not be provided in the conventional OLED device because of the IR drop.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display device including a relatively thick upper electrode in a pixel region.

Additional aspects will be set forth in the detailed description which follows, and, in part, will be apparent from the disclosure, or may be learned by practice of the inventive concept.

An exemplary embodiment discloses an organic light emitting display device that includes a substrate extending along a first direction, the substrate comprising a pixel region having a plurality of pixels and a transparent region that is located adjacent to the pixel region, a lower electrode disposed on the substrate in the pixel region, the lower electrode extending along the first direction, a light emitting layer disposed on the lower electrode, the light emitting layer extending along the first direction, and an upper electrode disposed on the light emitting layer in the pixel region, the upper electrode extending along the first direction. The upper electrode exposes the transparent region.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 10A, 10B, 10C, 10D, 10E, and 10F are cross sectional views illustrating a method of manufacturing an organic light emitting display device according to an exemplary embodiment.

FIG. 13 is a plan view illustrating an organic light emitting display device according to an exemplary embodiment.

FIG. 14 is a plan view illustrating an organic light emitting display device according to an embodiment.

DETAILED DESCRIPTION OF THE ILLUSTRATED EMBODIMENTS

Figure 1:
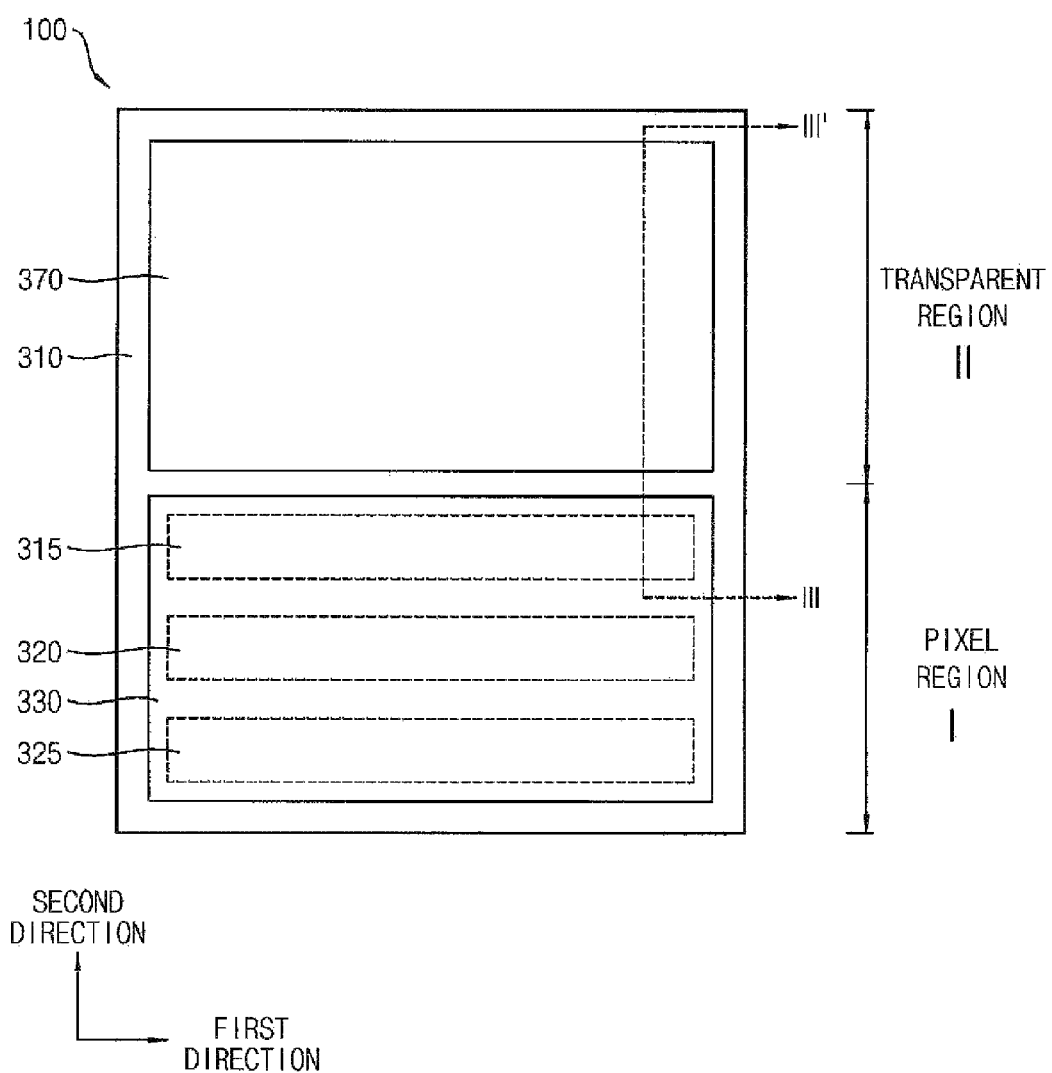
FIG. 1 is a plan view illustrating an organic light emitting display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be explained in detail with reference to the accompanying drawings.

FIG. 1 is a plan view illustrating an organic light emitting display device according to an exemplary embodiment.

Referring to FIG. 1, an organic light emitting display (OLED) device 100 may include a pixel region I and a transparent region II. A first sub-pixel 315, a second sub-pixel 320, and a third sub-pixel 325 may be located in the pixel region I, and a transparent window 370 may be located in the transparent region II.

In the pixel region I, the first sub-pixel 315 may be a pixel emitting a red color and may extend along a first direction. The second sub-pixel 320 may be a pixel emitting a green color and may be disposed substantially parallel to the first sub-pixel 315. The third sub-pixel 325 may be a pixel emitting a blue color and may be disposed substantially parallel to the first sub-pixel 315 and the second sub-pixel 320. The first, second, and third sub-pixels 315, 320, and 325 may be located at the same level on a substrate. For example, the first, second, and third sub-pixels 315, 320, and 325 may extend along the first direction because the first, second, and third sub-pixels 315, 320, and 325 are manufactured through a Small Mask Scanning (SMS) method.

In the transparent region II, the transparent window 370 may transmit an external light. Here, common lines (i.e., data lines, scan lines, power supply lines, etc.) and insulating layers (i.e., a pixel defining layer, a protection layer, etc.) may be disposed in a portion (e.g., a dead space) that surrounds the first, second, and third sub-pixels 315, 320, and 325 and the transparent window 370. For example, a pixel defining layer 310 may surround the first, second, and third sub-pixels 315, 320, and 325 and the transparent window 370.

In an exemplary embodiment, an upper electrode 330 of the OLED device 100 may be disposed on the first, second, and third sub-pixels 315, 320, and 325 in the pixel region I. The upper electrode 330 may extend along the first direction. In this case, the upper electrode 330 may not be located in the transparent region II. Thus, the upper electrode 330 may expose the transparent region II.

Figure 2:
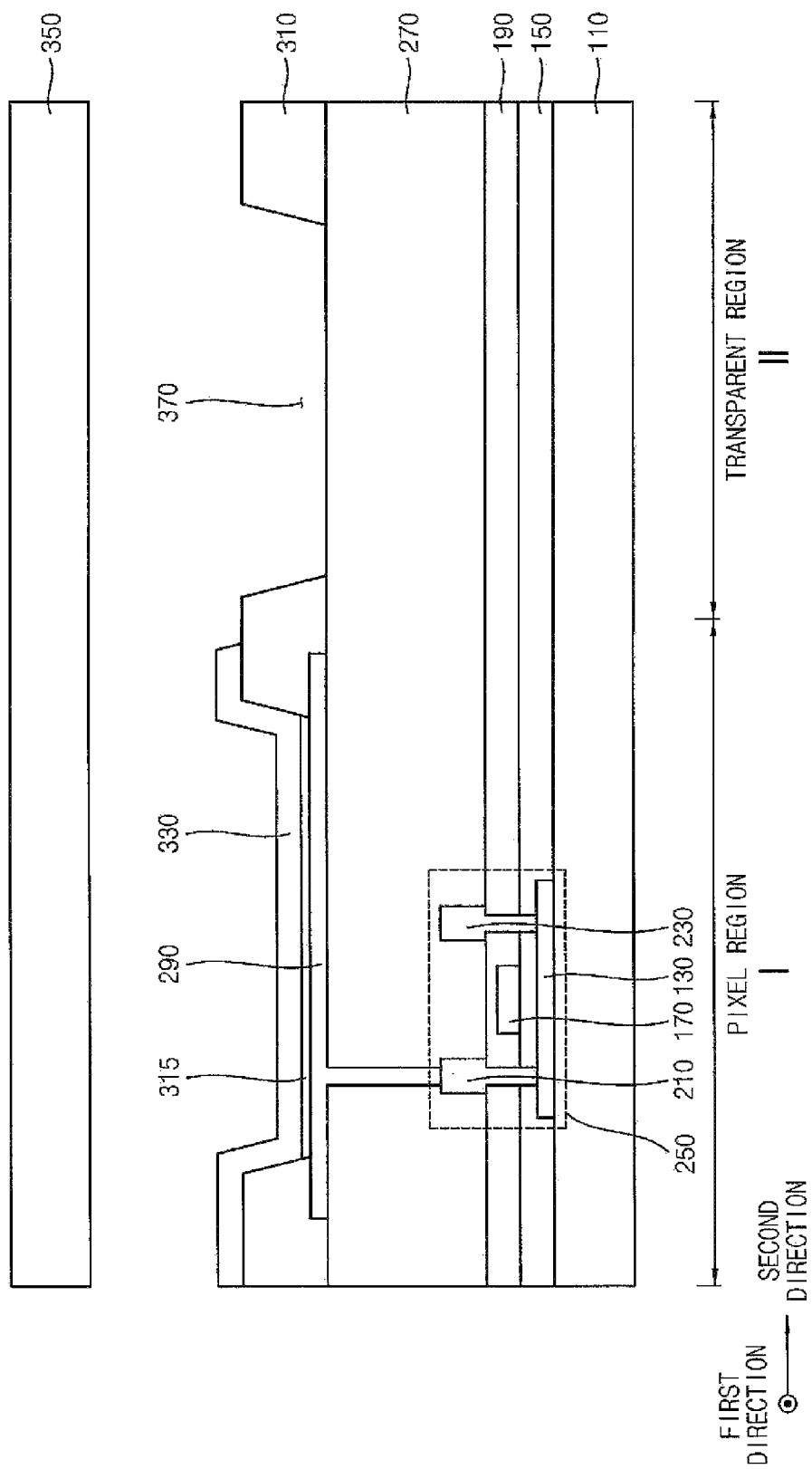
FIG. 2 is a cross sectional view illustrating an organic light emitting display device taken along line III-III' of FIG. 1.

FIG. 2 is a cross sectional view illustrating an organic light emitting display device taken along line III-III' of FIG. 1.

Referring to FIG. 2, an organic light emitting display (OLED) device 100 may include a substrate 110, a first insulating layer 150, a second insulating layer 190, a third insulating layer 270, a driving transistor 250, a lower electrode 290, a pixel defining layer 310, a light emitting layer of first sub-pixel 315 (equally applicable to the light emitting layers of the other sub-pixels 320 and 325), an upper electrode 330, a transparent window 370, and an encapsulation substrate 350. Here, the driving transistor 250 may include an active layer 130, a gate electrode 170, a source electrode 210, and a drain electrode 230.

As described above, the OLED device 100 may include a pixel region I and a transparent region II. The driving transistor 250, the lower electrode 290, the light emitting layer of first sub-pixel 315, and the upper electrode 330 may be located in the pixel region I. In addition, the transparent window 370 may be located in the transparent region II. For example, a display image may be displayed in the pixel region I. An image of an object that is located in the rear of the OLED device 100 may be transmitted in the transparent region II. Because the OLED device 100 has the transparent region II, the OLED device 100 may serve as a transparent display device.

The substrate 110 may include transparent materials. For example, the substrate 110 may include quartz, synthetic quartz, calcium fluoride, fluoride-doping quartz, a soda lime glass, and a non-alkali glass. The substrate 110 may include any other suitable material. In an alternative embodiment, the substrate 110 may include a flexible transparent resin substrate. Here, the flexible transparent resin substrate for the substrate 110 may include a polyimide substrate. For example, the polyimide substrate may include a first polyimide layer, a barrier film layer, and a second polyimide layer. When the polyimide substrate is thin and flexible, the polyimide substrate may be formed on a rigid glass substrate to help support the formation of an upper structure (e.g., the driving transistor 250, the lower electrode 290, the light emitting layer of first sub-pixel 315, and the upper electrode 330). Thus, in an exemplary embodiment, the substrate 110 may have a structure that includes the first polyimide layer, the barrier film layer, and the second polyimide layer stacked on a glass substrate. Here, after an insulation layer is disposed on the second polyimide layer, the upper structure may be disposed on the insulation layer. After the upper structure is formed on the insulation layer, the glass substrate may be removed. It may be difficult to directly form the upper structure on the polyimide substrate because the polyimide substrate is thin and flexible. Accordingly, the upper structure is formed on a rigid glass substrate, and then the polyimide substrate may serve as the substrate 110 after the removal of the glass substrate. Because the OLED device 100 includes the pixel region I and the transparent region II, the substrate 110 may also include the pixel region I and the transparent region II.

Referring to again FIG. 2, the buffer layer (not shown) may be disposed on the substrate 110. The buffer layer may extend from the pixel region I into the transparent region II. The buffer layer may prevent the diffusion of metal atoms and/or impurities from the substrate 110. Additionally, the buffer layer may control a rate of heat transfer in a crystallization process for forming an active layer 130, thereby obtaining a substantially uniform active layer 130. Furthermore, the buffer layer may improve surface flatness of the substrate 110 when a surface of the substrate 110 is relatively irregular. For example, the buffer layer may include at least one of silicon nitride and silicon oxide. The buffer layer may include any other suitable material. In an exemplary embodiment, according to a type of the substrate 110, at least two buffer layers may be provided on the substrate 110. In another exemplary embodiment the buffer layer may not be disposed on the substrate 110.

The driving transistor 250 may include the active layer 130, the gate electrode 170, the source electrode 210, and the drain electrode 230. In an exemplary embodiment, the active layer 130 may be disposed on the substrate 110. The active layer 130 may include at least one of an oxide semiconductor, an inorganic semiconductor (i.e., amorphous silicon, polysilicon, etc.), and an organic semiconductor. The active layer 130 may include any other suitable material.

The first insulating layer 150 may be disposed on the active layer 130. The first insulating layer 150 may cover the active layer 130 in the pixel region I, and may extend into the transparent region II. Thus, the first insulating layer 150 may be entirely disposed in the pixel region I and the transparent region II of the substrate 110. The first insulating layer 150 may include at least one of a silicon compound and a metal oxide. The first insulating layer 150 may include any other suitable material.

The gate electrode 170 may be disposed on the first insulating layer 150 directly over the active layer 130, which is located under the first insulating layer 150. The gate electrode 170 may include at least one of metal, metal alloy, metal nitride, conductive metal oxide, and transparent conductive materials. The gate electrode 170 may include any other suitable material.

The second insulating layer 190 may be disposed on the gate electrode 170. The second insulating layer 190 may cover the gate electrode 170 in the pixel region I and may extend into the transparent region II. Thus, the second insulating layer 190 may be entirely disposed in the pixel region I and the transparent region II of the substrate 110. The second insulating layer 190 may include at least one of a silicon compound and a metal oxide. The second insulating layer 190 may include any other suitable material.

The source electrode 210 and the drain electrode 230 may be disposed on the second insulating layer 190. The source electrode 210 may contact a first side of the active layer 130 by removing a portion of the first and second insulating layer 150 and 190. The drain electrode 230 may contact a second side of the active layer 130 by removing a second portion of the first and second insulating layer 150 and 190. Each of the source electrode 210 and the drain electrode 230 may include at least one of metal, metal alloy, metal nitride, conductive metal oxide, and transparent conductive materials. The source electrode 210 and the drain electrode 230 may include any other suitable material.

The third insulating layer 270 may be disposed on the source electrode 210 and the drain electrode 230. The third insulating layer 270 may cover the source electrode 210 and the drain electrode 230 in the pixel region I, and may extend into the transparent region II. Thus, the third insulating layer 270 may be entirely disposed in the pixel region I and the transparent region II of the substrate 110. The third insulating layer 270 may include at least one of a silicon compound and a metal oxide. The third insulating layer 270 may include any other suitable material.

As illustrated in FIG. 2, the lower electrode 290 may be disposed on the third insulating layer 270. The lower electrode 290 may contact the source electrode 210 by removing a portion of the third insulating layer 270. The lower electrode 290 may include at least one of metal, metal alloy, metal nitride, conductive metal oxide, and transparent conductive materials.

The pixel defining layer 310 may be disposed the on third insulating layer 270 to expose a portion of the lower electrode 290. The pixel defining layer 310 may include at least one of organic materials and inorganic materials. In this case, the pixel defining layer 310 may include a first opening and a second opening. In the pixel region I, the first opening of the pixel defining layer 310 may expose a portion of the lower electrode 290. The light emitting layer of first sub-pixel 315 may be disposed on the exposed lower electrode 290. In addition, in the transparent region II, the second opening of the pixel defining layer 310 may expose a portion of the third insulating layer 270. The second opening may be the transparent window 370. In an alternate embodiment, the second opening may not be disposed on the third insulating layer 270, and the transparent region II may be the transparent window 370. Thus, the pixel defining layer 310 may have a plan upper surface in the transparent region II.

The light emitting layer of first sub-pixel 315 may be disposed on the exposed lower electrode 290. The light emitting layer of first sub-pixel 315 may be formed using light emitting materials capable of generating different colors of light (e.g., a red color of light, a blue color of light, and a green color of light) according to the first, second, and third sub-pixels 315, 320, and 325 illustrated in FIG. 1. For example, the light emitting layer of first sub-pixel 315 illustrated in FIG. 2 may be formed using the light emitting material capable of generating the red color of light.

The upper electrode 330 may be disposed on the pixel defining layer 310 and the light emitting layer of first sub-pixel 315 in the pixel region I. The upper electrode 330 may not be located in the transparent region II. Thus, the upper electrode 330 may expose the transparent region II. The upper electrode 330 may be shared by the first, second, and third sub-pixels 315, 320, and 325 (shown in FIG. 1). In an exemplary embodiment, the upper electrode 330 may be relatively thick. For example, a thickness of the upper electrode 330 may be over about 100 Å (angstrom). In this case, a light transmissivity of the upper electrode 330 may be below about 50%. The upper electrode 330 may include at least one of metal, metal alloy, metal nitride, conductive metal oxide, and a transparent conductive material. For example, the upper electrode 330 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide ($SnO_x$), indium oxide ($InO_x$), gallium oxide ($GaO_x$), gallium zinc oxide (GZO), and indium zinc oxide (IZO). The upper electrode 330 may use any other suitable material as well. In an exemplary embodiment, the upper electrode 330 may include magnesium-silver (Mg—Ag) alloy. Compared to a conventional OLED device, the OLED device 100 includes the relatively thick upper electrode 330, resulting in a reduced generation of IR drop (i.e., voltage drop) in the OLED device 100. Accordingly, a uniform luminance may be provided in the OLED device 100. In addition, because the upper electrode 330 is not located in the transparent region II, the transmissivity of the OLED device 100 may be increased. A definition (e.g., visibility) of an image of an object that is located in the rear (e.g., at the back) of the OLED device 100 may be increased.

The encapsulation substrate 350 may be disposed on the upper electrode 330, pixel defining layer 310, and the transparent window 370. The encapsulation substrate 350 and the substrate 110 may include substantially the same materials. For example, the encapsulation substrate 350 may include at least one of quartz, synthetic quartz, calcium fluoride, fluoride-doping quartz, soda lime glass, and non-alkali glass. The encapsulation substrate 350 may include any other suitable material. In an exemplary embodiment, the encapsulation substrate 350 may include at least one of a transparent inorganic material and a flexible plastic. For example, the encapsulation substrate 350 may include a flexible transparent resin substrate. In this case, to increase flexibility of the OLED device 100, the encapsulation substrate 350 may include a stacked structure where at least one organic layer and at least one inorganic layer are alternately stacked. In an alternate embodiment, when the first insulating layer 150, the second insulating layer 190, and the third insulating layer 270 have the same materials, and the substrate 110, the encapsulation substrate 350, the first insulating layer 150, the second insulating layer 190, and the third insulating layer 270 have a same (or similar) refractive index, a light incident into the transparent region II may not be refracted by the interfaces of the substrate 110, the encapsulation substrate 350, the first insulating layer 150, the second insulating layer 190, and the third insulating layer 270. Accordingly, the transmissivity of the OLED device 100 may be increased, and the definition of the image may be improved.

The OLED device 100 according to exemplary embodiments includes the relatively thick upper electrode 330, which may only be located in the pixel region I. Accordingly, the OLED device 100 may serve as a transparent display device with improved transmissivity. In addition, because the upper electrode 330 is not located in the transparent region II, the OLED device 100 may have increased transmissivity. The OLED device 100 may have an increased definition of the image of the object that is located in the rear of the OLED device 100. Further, when the first insulating layer 150, the second insulating layer 190, and the third insulating layer 270 include the same materials, the OLED device 100 may have a decrease in contact interfaces capable of reflecting a light. Thus, the resulting OLED device 100 may have an increased transmissivity and definition of the image of the object that is located in the rear of the OLED device 100.

Figure 3:
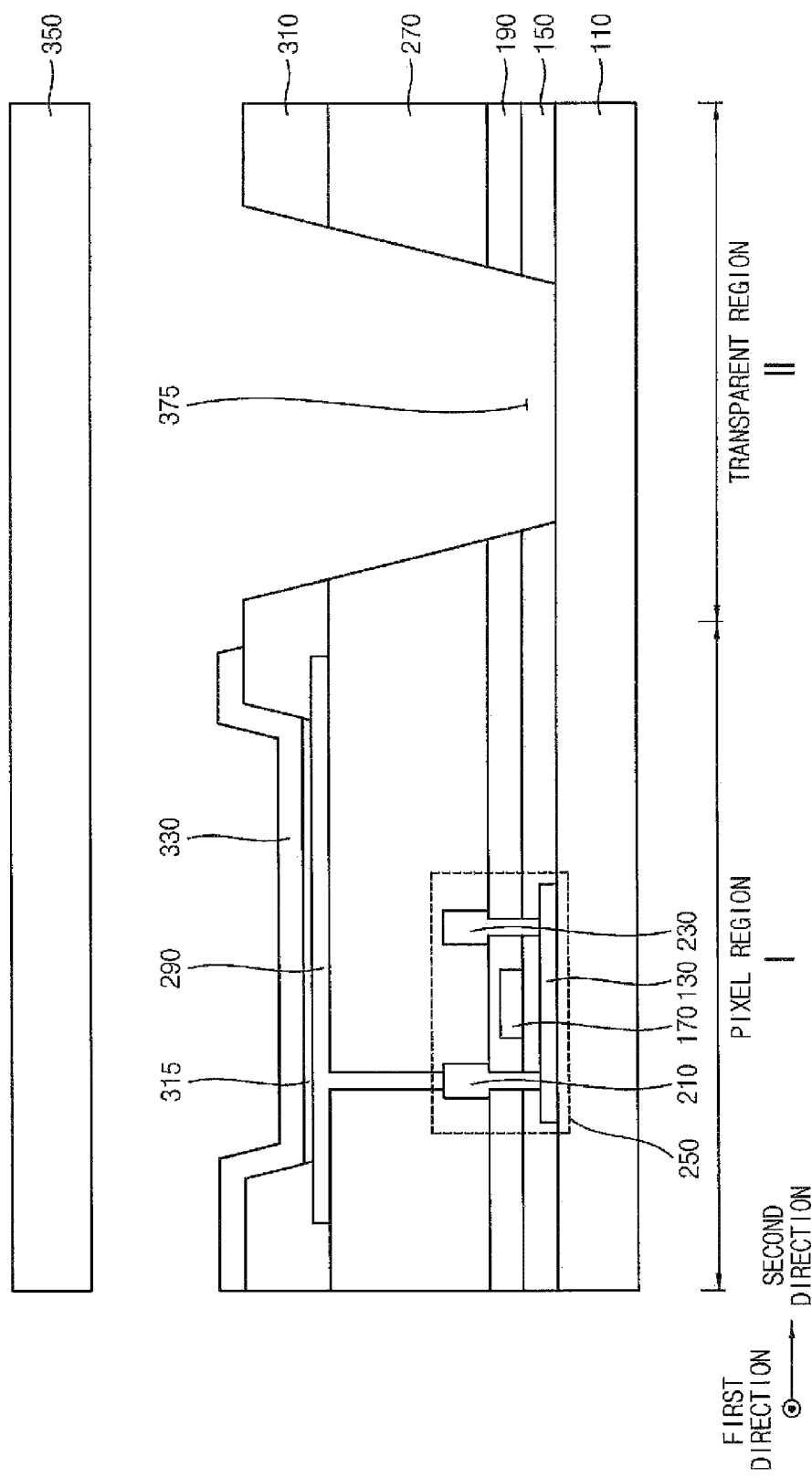
FIG. 3 is a cross sectional view illustrating an organic light emitting display device according to an exemplary embodiment.

FIG. 3 is a cross sectional view illustrating an organic light emitting display device according to an exemplary embodiment. An organic light emitting display device illustrated in FIG. 3 may have a configuration substantially similar the organic light emitting display device 100 described with reference to FIG. 2 except for a shape of transparent window 375. In FIG. 3, detailed descriptions for elements that are substantially similar to the elements described with reference to FIG. 2 will be omitted for brevity.

Referring to FIG. 3, an organic light emitting display (OLED) device may include at least one of a substrate 110, a first insulating layer 150, a second insulating layer 190, a third insulating layer 270, a driving transistor 250, a lower electrode 290, a pixel defining layer 310, a light emitting layer of first sub-pixel 315, an upper electrode 330, a transparent window 375, and an encapsulation substrate 350. Here, the driving transistor 250 may include an active layer 130, a gate electrode 170, a source electrode 210, and a drain electrode 230. In an exemplary embodiment, the OLED device may include a pixel region I and a transparent region II. The driving transistor 250, the lower electrode 290, the light emitting layer of first sub-pixel 315, and the upper electrode 330 may be located in the pixel region I. In addition, the transparent window 375 may be located in the transparent region II. For example, a display image may be displayed in the pixel region I. An image of an object that is located in the rear of the OLED device may be transmitted in the transparent region II. Accordingly, the OLED device having the transparent region II may serve as a transparent display device.

The pixel defining layer 310 may be disposed on the third insulating layer 270 to expose a portion of the lower electrode 290. The pixel defining layer 310 may include at least one of organic materials and inorganic materials. In this case, the pixel defining layer 310 may include a first opening and a second opening. In the pixel region I, the first opening of the pixel defining layer 310 may expose a portion of the lower electrode 290. The light emitting layer of first sub-pixel 315 may be disposed on the exposed lower electrode 290. In addition, in the transparent region II, the second opening of the pixel defining layer 310 may expose a portion of the third insulating layer 270. The second opening of the pixel defining layer 310 may extend through the third insulating layer 270, the second insulating 190, and the first insulating layer. The second opening may be the transparent window 375. In an exemplary embodiment, the transparent window 375 may be formed by removing a portion of the first insulating layer 150, a portion of the second insulating layer 190, a portion of the third insulating layer 270, and a portion of the pixel defining layer 310. In an exemplary embodiment, portions of the insulating layers may not be located in the transparent region II. In other words, the insulating layers may expose the transparent region II. In an alternate embodiment, at least one insulating layer may be located in the entire transparent region II. Accordingly, when the insulating layers are not located in the second opening, a transmissivity of the transparent region II may be substantially increased. Because the refraction and reflection of a light is prevented in an interlayer of the insulating layers, the OLED device may have an increased definition of an image of an object that is located in the rear of the OLED device.

Figure 4:
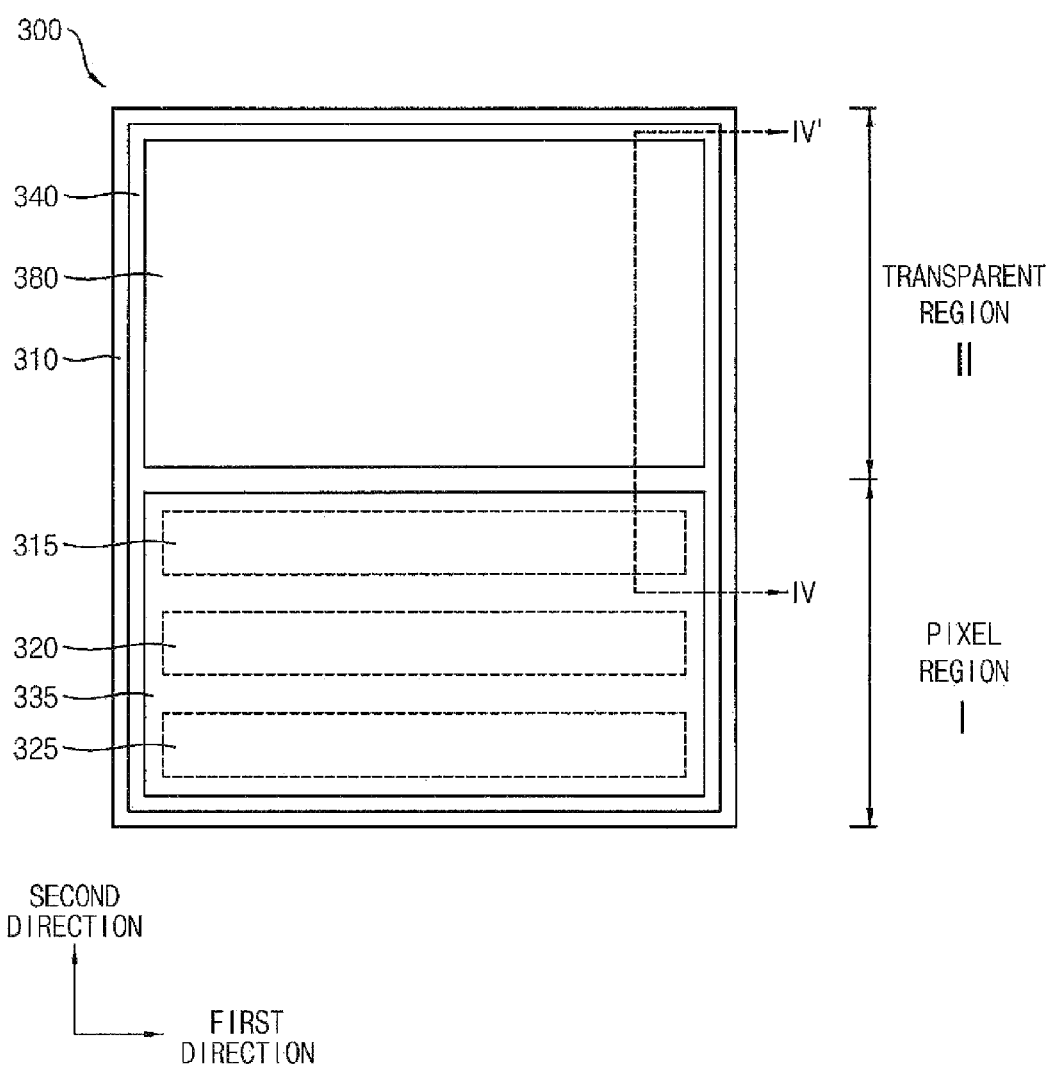
FIG. 4 is a plan view illustrating an organic light emitting display device according to an exemplary embodiment.

FIG. 4 is a plan view illustrating an organic light emitting display device according to an exemplary embodiment. An organic light emitting display device 300 illustrated in FIG. 4 may have a configuration substantially similar to an organic light emitting display device 100 described with reference to FIG. 1 except for an auxiliary electrode 340. In FIG. 4, detailed descriptions for elements that are substantially similar to the elements described with reference to FIG. 1 will be omitted for brevity.

Referring to FIG. 4, an organic light emitting display (OLED) device 300 may include a pixel region I and a transparent region II. A first sub-pixel; 315, a second sub-pixel 320, and a third sub-pixel 325 may be located in a pixel region I and a transparent window 380 may be located in the transparent region II. In addition, an auxiliary electrode 340 may be entirely located on the substrate 110 in the pixel region I and the transparent region II.

In the pixel region I, the first sub-pixel 315 may be a pixel emitting a red color and may extend along a first direction. The second sub-pixel 320 may be a pixel emitting a green color and may be disposed substantially parallel to the first sub-pixel 315. The third sub-pixel 325 may be a pixel emitting a blue color and may be disposed substantially parallel to the first sub-pixel 315 and the second sub-pixel 320. The first, second, and third sub-pixels 315, 320, and 325 may be located at the same level on a substrate. For example, the first, second, and third sub-pixels 315, 320, and 325 may extend along the first direction because the first, second, and third sub-pixels 315, 320, and 325 are manufactured through an SMS method.

In the transparent region II, the transparent window 380 may transmit an external light. Here, common lines and insulating layers may be disposed in a portion that surrounds the first, second, and third sub-pixels 315, 320, and 325 and the transparent window 380. For example, a pixel defining layer 310 may surround the first, second, and third sub-pixels 315, 320, and 325 and the transparent window 380.

In an exemplary embodiment, an upper electrode 335 of the OLED device 300 may be disposed on the first, second, and third sub-pixels 315, 320, and 325 in the pixel region I and may extend along the first direction. Here, the upper electrode 335 may not be located in the transparent region II. Thus, the upper electrode 335 may expose the transparent region II. In addition, the auxiliary electrode 340 may be interposed between the upper electrode 335 and the first, second, and third sub-pixels 315, 320, and 325 and may extend along the first direction. Thus, the auxiliary electrode 340 may be located in the transparent region II. In an exemplary embodiment, because the first, second, and third sub-pixels 315, 320, and 325 and the auxiliary electrode 340 are disposed through the SMS method, the auxiliary electrode 340 may be disposed in the same chamber as the first, second, and third sub-pixels 315, 320, and 325 after the first, second, and third sub-pixels 315, 320, and 325 are disposed. Then, an upper electrode 335 may be obtained through a Fine Metal Mask (FMM) method.

Figure 5:
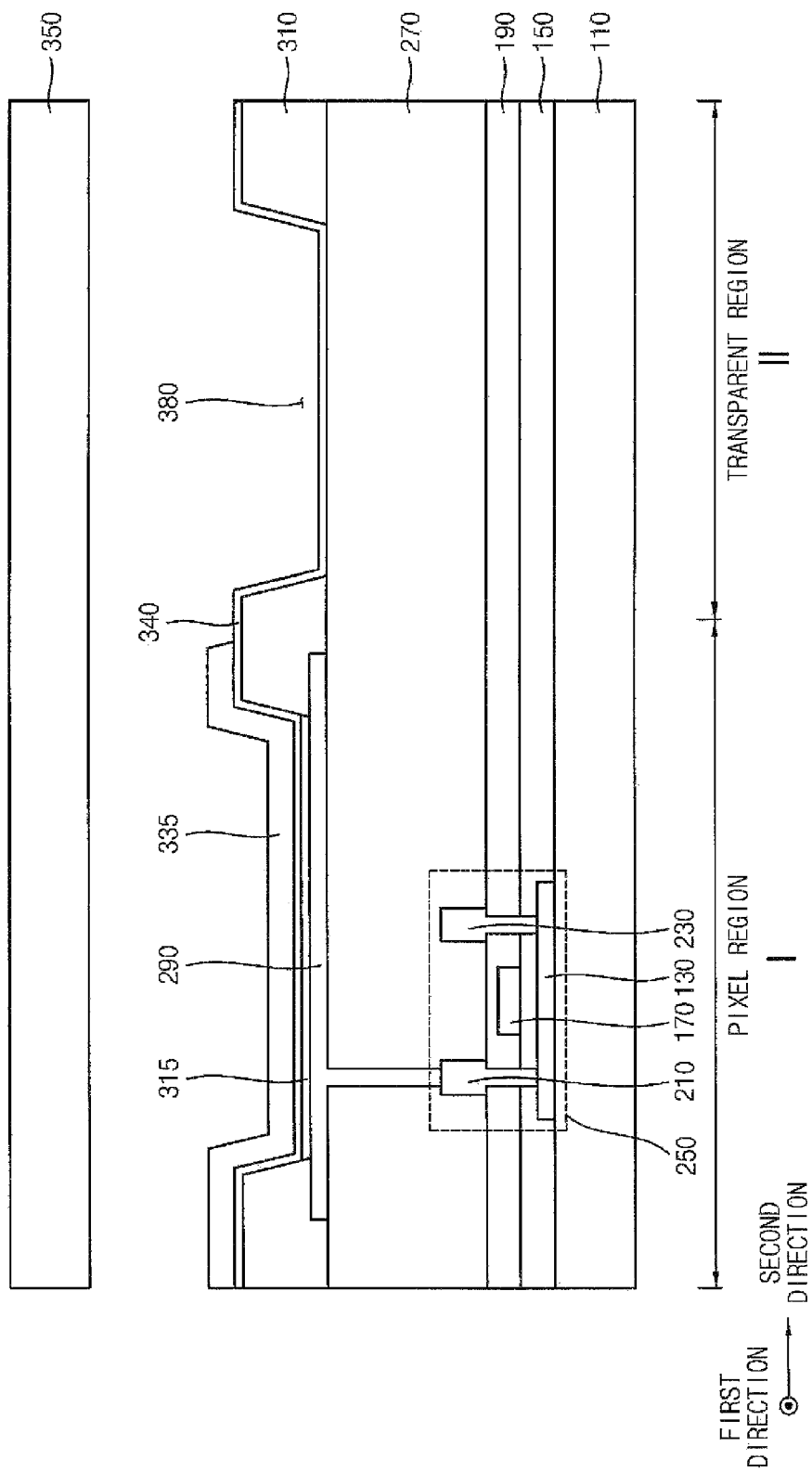
FIG. 5 is a cross sectional view illustrating an organic light emitting display device taken along line IV-IV' of FIG. 4.

FIG. 5 is a cross sectional view illustrating an organic light emitting display device taken along a line IV-IV' of FIG. 4. An organic light emitting display device 300 illustrated in FIG. 5 may have a configuration substantially similar to organic light emitting display device 100 described with reference to FIG. 2 except for an auxiliary electrode 340. In FIG. 5, detailed descriptions for elements, which are substantially to the elements described with reference to FIG. 2, will be omitted for brevity.

Referring to FIG. 5, an organic light emitting display (OLED) device 300 may include a substrate 110, a first insulating layer 150, a second insulating layer 190, a third insulating layer 270, a driving transistor 250, a lower electrode 290, a pixel defining layer 310, a light emitting layer of first sub-pixel 315, an upper electrode 335, an auxiliary electrode 340, a transparent window 380, and an encapsulation substrate 350. Here, the driving transistor 250 may include an active layer 130, a gate electrode 170, a source electrode 210, and a drain electrode 230.

As described above, the OLED device 300 may include a pixel region I and a transparent region II. The driving transistor 250, the lower electrode 290, the light emitting layer of first sub-pixel 315, and the upper electrode 335 may be located in the pixel region I. The transparent window 380 may be located in the transparent region II. In addition, the auxiliary electrode 340 may be entirely located on the substrate 110 in the pixel region I and the transparent region II. For example, a display image may be displayed in the pixel region I. An image of an object that is located in the rear of the OLED device 300 may be transmitted in the transparent region II. Because the OLED device 300 has the transparent region II, the OLED device 300 may serve as a transparent display device.

The pixel defining layer 310 may be disposed on the third insulating layer 270 to expose a portion of the lower electrode 290. The pixel defining layer 310 may include at least one of organic materials and inorganic materials. In this case, the pixel defining layer 310 may include a first opening and a second opening. In the pixel region I, the first opening of the pixel defining layer 310 may expose a portion of the lower electrode 290. The light emitting layer of first sub-pixel 315 may be disposed on the exposed lower electrode 290. In addition, in the transparent region II, the second opening of the pixel defining layer 310 may expose a portion of the third insulating layer 270. The second opening may be the transparent window 380.

The light emitting layer of first sub-pixel 315 may be disposed on the exposed lower electrode 290. The light emitting layer of first sub-pixel 315 may be formed using light emitting materials capable of generating different colors of light (e.g., a red color of light, a blue color of light, and a green color of light) according to the first, second, and third sub-pixels 315, 320, and 325 illustrated in FIG. 4. For example, the light emitting layer of first sub-pixel 315 illustrated in FIG. 5 may be formed using the light emitting material capable of generating the red color of light.

The auxiliary electrode 340 may be disposed on the pixel defining layer 310, the light emitting layer of first sub-pixel 315, and a portion of the third insulating layer 270. The auxiliary electrode 340 may cover the pixel defining layer 310 and the light emitting layer of first sub-pixel 315 and may extend into the transparent region II in a second direction that is substantially perpendicular to the first direction. Thus, the auxiliary electrode 340 may be located in the transparent region II. The auxiliary electrode 340 may be shared by the first, second, and third sub-pixels 315, 320, and 325. Compared to the upper electrode 335, the auxiliary electrode 340 may be relatively thin. For example, a thickness of the auxiliary electrode 340 may be below about 75 Å (angstrom). In this case, a light transmissivity of the auxiliary electrode 340 may be over about 50%. The auxiliary electrode 340 may include at least one of metal, metal alloy, metal nitride, conductive metal oxide, and a transparent conductive material. For example, the auxiliary electrode 340 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide (SnOx), indium oxide ($InO_x$), gallium oxide ($GaO_x$), gallium zinc oxide (GZO), and indium zinc oxide (IZO). The auxiliary electrode 340 may use any other suitable material as well.

The upper electrode 335 may be disposed on the auxiliary electrode 340 in the pixel region I. Here, the upper electrode 335 may electrically contact the auxiliary electrode 340. The upper electrode 335 may not be located in the transparent region II. That is, the upper electrode 335 may expose the transparent region II. The upper electrode 335 may be shared by the first through third sub-pixels 315, 320, and 325. Compared to the auxiliary electrode 340, the upper electrode 335 may have a relatively thick thickness. For example, a thickness of the upper electrode 335 may be over about 100 um. Here, a light transmissivity of the upper electrode 335 may be below about 50%. The upper electrode 335 may include at least one of metal, metal alloy, metal nitride, conductive metal oxide, and a transparent conductive material. The upper electrode 335 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide (SnOx), indium oxide ($InO_x$), gallium oxide ($GaO_x$), gallium zinc oxide (GZO), and indium zinc oxide (IZO). In an exemplary embodiment, the upper electrode 335 may include Mg—Ag alloy. Compared to a conventional OLED device, the OLED device 300 includes the relatively thick upper electrode 335 and the auxiliary electrode 340, resulting in a reduced generation of an IR drop in the OLED device 300.

Accordingly, a uniform luminance may be provided in the OLED device 300. In addition, because the relatively thin auxiliary electrode 340 is located in the transparent region II, the transmissivity of the OLED device 300 may not be significantly decreased.

Figure 6:
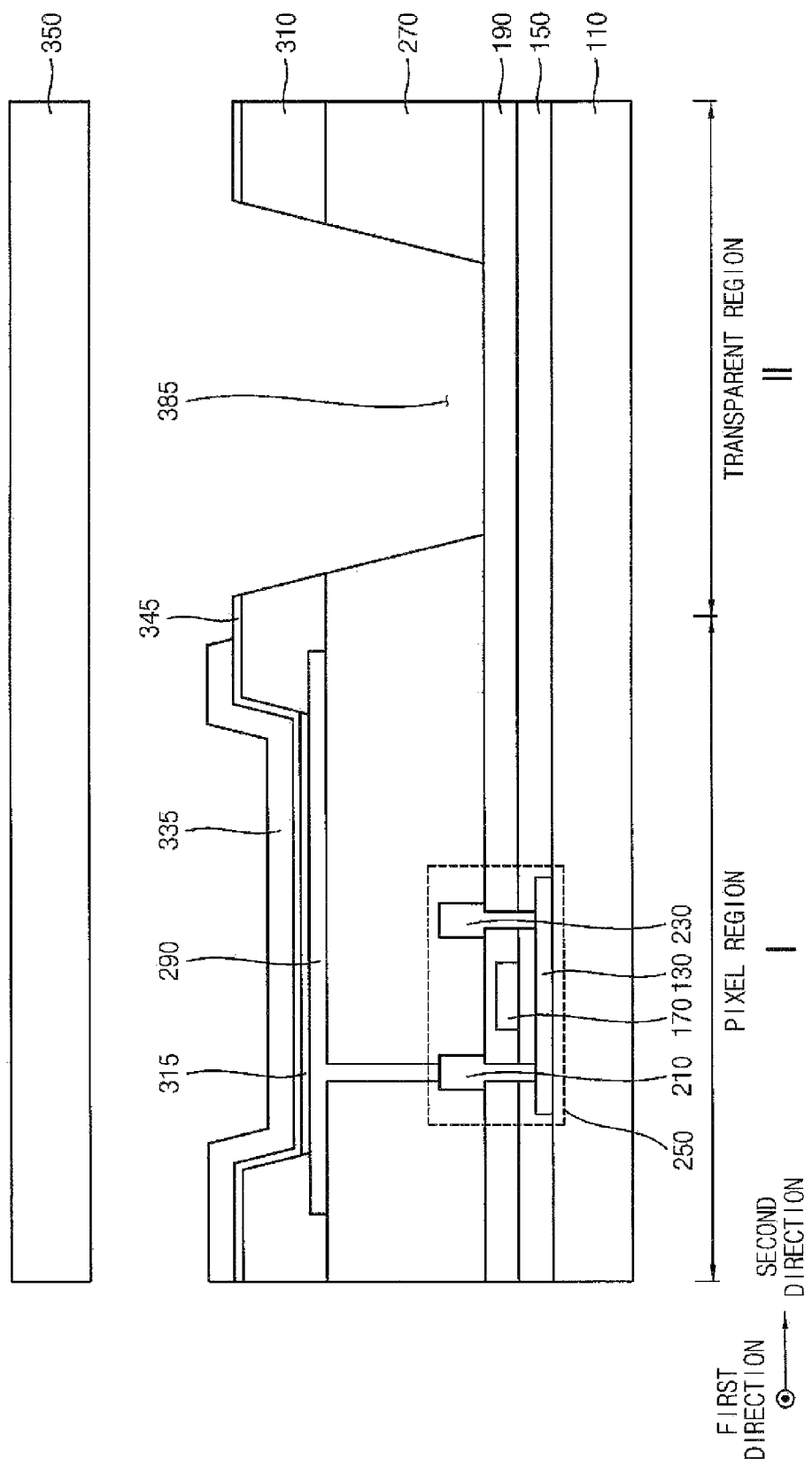
FIG. 6 is a cross sectional view illustrating an organic light emitting display device according to an exemplary embodiment.

FIG. 6 is a cross sectional view illustrating an organic light emitting display device according to an exemplary embodiment. An organic light emitting display device illustrated in FIG. 6 may have a configuration substantially similar to organic light emitting display device 300 described with reference to FIG. 5 except for a shape of an auxiliary electrode 345 and a transparent window 385. In FIG. 6, detailed descriptions for elements that are substantially similar to the elements described with reference to FIG. 5 will be omitted for brevity.

Referring to FIG. 6, an organic light emitting display (OLED) device may include a substrate 110, a first insulating layer 150, a second insulating layer 190, a third insulating layer 270, a driving transistor 250, a lower electrode 290, a pixel defining layer 310, a light emitting layer of first sub-pixel 315, an upper electrode 335, an auxiliary electrode 345, a transparent window 385, and an encapsulation substrate 350. Here, the driving transistor 250 may include an active layer 130, a gate electrode 170, a source electrode 210, and a drain electrode 230. In an exemplary embodiment, the OLED device may include a pixel region I and a transparent region II. The driving transistor 250, the lower electrode 290, the light emitting layer of first sub-pixel 315, and the upper electrode 335 may be located in the pixel region I. The transparent window 385 may be located in the transparent region II. In addition, the auxiliary electrode 345 may be entirely located on the substrate 110 in the pixel region I. For example, a display image may be displayed in the pixel region I. An image of an object that is located in the rear of the OLED device may be transmitted in the transparent region II. Accordingly, the OLED device having the transparent region II may serve as a transparent display device.

The pixel defining layer 310 may be disposed on the third insulating layer 270 to expose a portion of the lower electrode 290. The pixel defining layer 310 may include at least one of organic material and inorganic materials. In this case, the pixel defining layer 310 may include a first opening and a second opening. In the pixel region I, the first opening of the pixel defining layer 310 may expose a portion of the lower electrode 290. The light emitting layer of first sub-pixel 315 may be disposed on the exposed lower electrode 290. In addition, in the transparent region II, the second opening of the pixel defining layer 310 may expose a portion of the third insulating layer 270. The second opening may also extend through the third insulating layer 270 exposing a portion of the second insulating layer 190. The second opening may be the transparent window 385. In an exemplary embodiment, the transparent window 385 may be formed by removing a portion of the auxiliary electrode 345, a portion of the third insulating layer 270, and a portion of the pixel defining layer 310. In an exemplary embodiment, portions of the third insulating layer 270, the pixel defining layer 310, and the auxiliary electrode 345 may not be located in the transparent region II. In an alternative embodiment, at least one insulating layer and/or at least one electrode may be located in the entire transparent region II. Accordingly, when the insulating layers and the electrodes are not located in the second opening, a transmissivity of the transparent region II may further be substantially increased. The OLED device has the auxiliary electrode 345, resulting in a reduction of the generation of an IR drop in the OLED device. In addition, because the refraction and reflection of a light is prevented in an interlayer of the insulating layers and the electrode, the OLED device may have an increased definition of an image of an object that is located in the rear of the OLED device.

Figure 7:
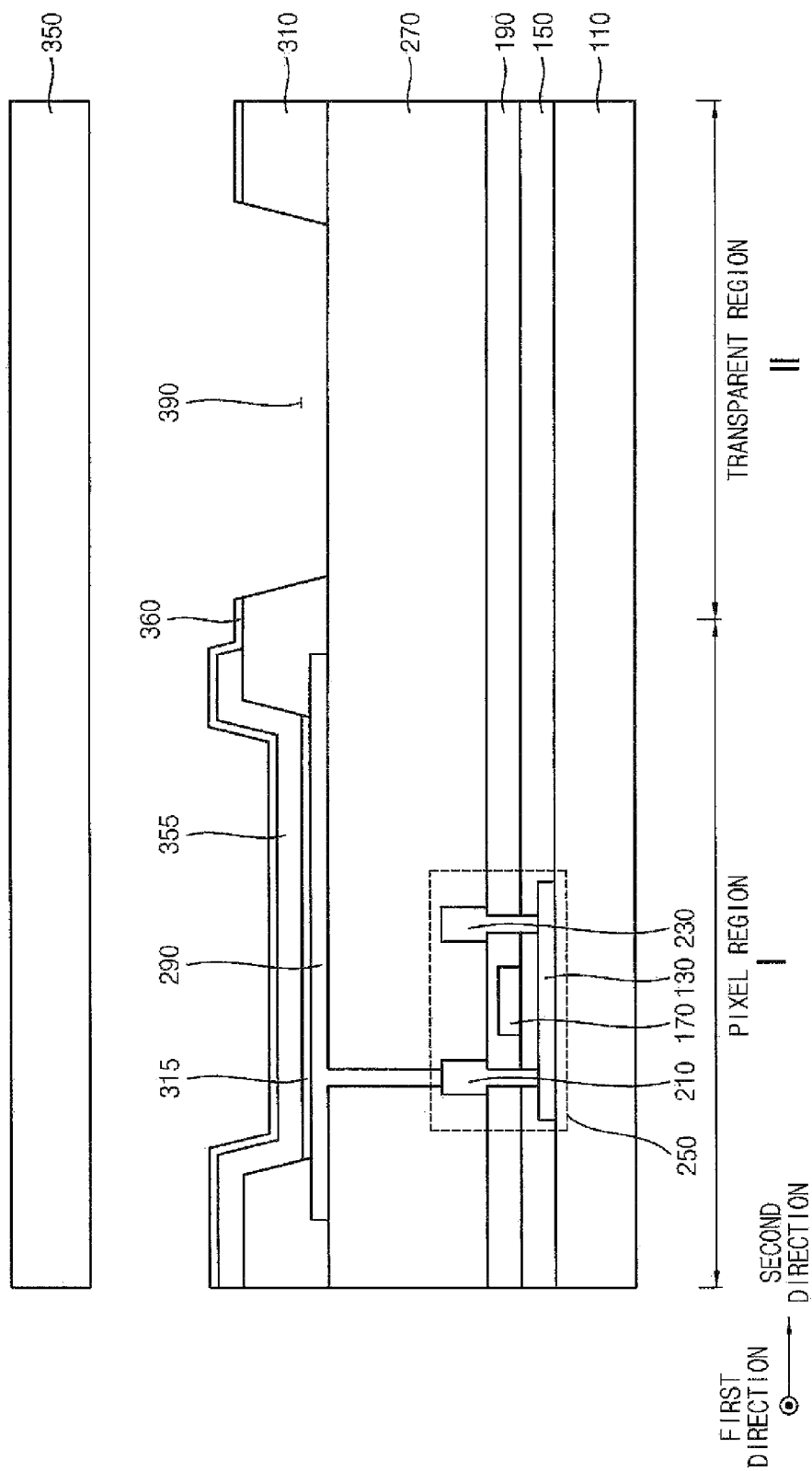
FIG. 7 is a cross sectional view illustrating an organic light emitting display device according to an exemplary embodiment.

FIG. 7 is a cross sectional view illustrating an organic light emitting display device according to an exemplary embodiment. An organic light emitting display device illustrated in FIG. 7 may have a configuration substantially similar to organic light emitting display device 300 described with reference to FIG. 5 except for a shape of an upper electrode 355, an auxiliary electrode 360, and a transparent window 390. In FIG. 7, detailed descriptions for elements that are substantially similar to the elements described with reference to FIG. 5 will be omitted for brevity.

Referring to FIG. 7, an organic light emitting display (OLED) device may include a substrate 110, a first insulating layer 150, a second insulating layer 190, a third insulating layer 270, a driving transistor 250, a lower electrode 290, a pixel defining layer 310, a light emitting layer of first sub-pixel 315, an upper electrode 355, an auxiliary electrode 360, a transparent window 390, and an encapsulation substrate 350. Here, the driving transistor 250 may include an active layer 130, a gate electrode 170, a source electrode 210, and a drain electrode 230.

As described above, the OLED device may include a pixel region I and a transparent region II. The driving transistor 250, the lower electrode 290, the light emitting layer of first sub-pixel 315, and the upper electrode 355 may be located in the pixel region I. The transparent window 390 may be located in the transparent region II. For example, a display image may be displayed in the pixel region I. An image of an object that is located in the rear of the OLED device may be transmitted in the transparent region II. Accordingly the OLED device having the transparent region II may serve as a transparent display device.

The pixel defining layer 310 may be disposed on the third insulating layer 270 to expose a portion of the lower electrode 290. The pixel defining layer 310 may include a first opening and a second opening. In the pixel region I, the first opening of the pixel defining layer 310 may expose a portion of the lower electrode 290. The light emitting layer of first sub-pixel 315 may be disposed on the exposed lower electrode 290. In addition, in the transparent region II, the second opening of the pixel defining layer 310 may expose a portion of the third insulating layer 270. The second opening may be the transparent window 390. The pixel defining layer 310 may include at least one of organic materials and inorganic materials.

The upper electrode 355 may be disposed on the pixel defining layer 310 and light emitting layer of first sub-pixel 315 in the pixel region I. The upper electrode 355 may not be located in the transparent region II. Thus, the upper electrode 355 may expose the transparent region II. In an exemplary embodiment, the upper electrode 355 may be relatively thick. For example, a thickness of the upper electrode 355 may be over about 100 Å (angstrom). Here, a light transmissivity of the upper electrode 355 may be below about 50%. The upper electrode 355 may include at least one of metal, metal alloy, metal nitride, conductive metal oxide, and a transparent conductive material. The upper electrode 355 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide ($SnO_x$), indium oxide ($InO_x$), gallium oxide ($GaO_x$), gallium zinc oxide (GZO), and indium zinc oxide (IZO). The upper electrode 355 may include any other suitable material. In an exemplary embodiment, the upper electrode 355 may include Mg—Ag alloy.

The auxiliary electrode 360 may be disposed on the upper electrode 355 and a portion of pixel defining layer 310. The auxiliary electrode 360 may cover the upper electrode 355 and a portion of the pixel defining layer 310. Thus, a portion of auxiliary electrode 360 may not be located in the transparent region II. In other words, the auxiliary electrode 360 may expose the transparent region II. Compared to the upper electrode 355, the auxiliary electrode 360 may be relatively thin. For example, a thickness of the auxiliary electrode 360 may be below about 75 Å (angstrom). In this case, a light transmissivity of the auxiliary electrode 360 may be over about 50%. The auxiliary electrode 360 may include at least one of metal, metal alloy, metal nitride, conductive metal oxide, and a transparent conductive material. The auxiliary electrode 360 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide ($SnO_x$), indium oxide ($InO_x$), gallium oxide ($GaO_x$), gallium zinc oxide (GZO), and indium zinc oxide (IZO) The auxiliary electrode 360 may include any other suitable material as well.

Compared to a conventional OLED device, the OLED device of the exemplary embodiment includes the relatively thick upper electrode 355 and the relatively thin auxiliary electrode 360, resulting in a reduction of the generation of an IR in the OLED device. In addition, because the auxiliary electrode 360 is not located in a portion of the transparent region II, a transmissivity of the transparent region II may further be substantially increased. Thus, an OLED device may have an increased definition of an image of an object that is located in the rear of the OLED device.

Figure 8:
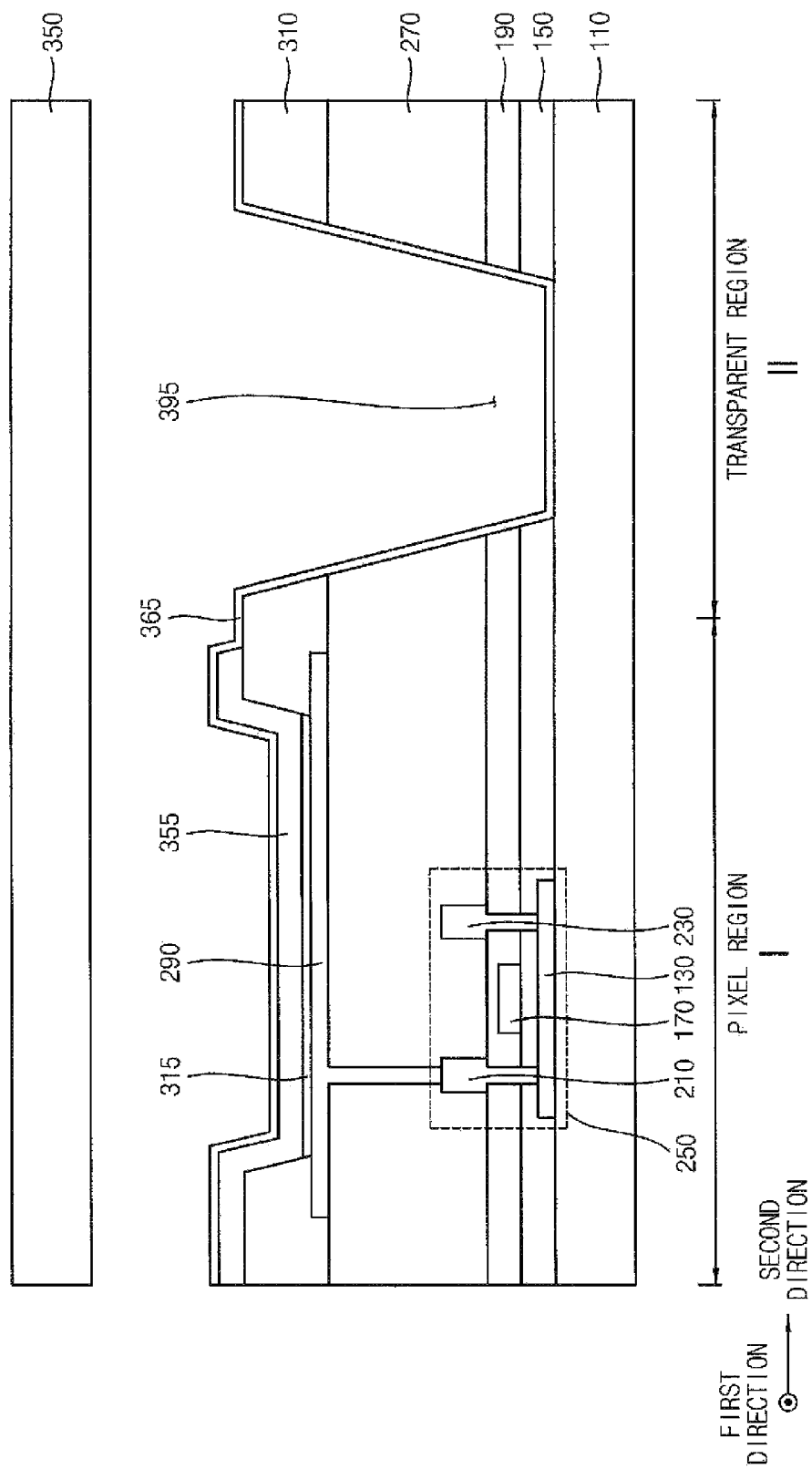
FIG. 8 is a cross sectional view illustrating an organic light emitting display device according to an exemplary embodiment.

FIG. 8 is a cross sectional view illustrating an organic light emitting display device according to an exemplary embodiment. An organic light emitting display device illustrated in FIG. 8 may have a configuration substantially similar to an organic light emitting display device described with reference to FIG. 7 except for a shape of an auxiliary electrode 365 and a transparent window 395. In FIG. 8, detailed descriptions for elements, which are substantially the same as or similar to the elements described with reference to FIG. 7, will be omitted.

Referring to FIG. 8, an organic light emitting display (OLED) device may include a substrate 110, a first insulating layer 150, a second insulating layer 190, a third insulating layer 270, a driving transistor 250, a lower electrode 290, a pixel defining layer 310, a light emitting layer of first sub-pixel 315, an upper electrode 355, an auxiliary electrode 365, a transparent window 395, and an encapsulation substrate 350. Here, the driving transistor 250 may include an active layer 130, a gate electrode 170, a source electrode 210, and a drain electrode 230. In an exemplary embodiment, the OLED device may include a pixel region I and a transparent region II. The driving transistor 250, the lower electrode 290, the light emitting layer of first sub-pixel 315, and the upper electrode 355 may be located in the pixel region I. The transparent window 395 may be located in the transparent region II. In addition, the auxiliary electrode 365 may be entirely located on the substrate 110 in the pixel region I. For example, a display image may be displayed in the pixel region I. An image of an object that is located in the rear of the OLED device may be transmitted in the transparent region II. Accordingly, the OLED device having the transparent region II may serve as a transparent display device.

The pixel defining layer 310 may be disposed on a portion of the third insulating layer 270 and a portion of the lower electrode 290. The pixel defining layer 310 may include a first opening and a second opening. In the pixel region I, the first opening of the pixel defining layer 310 may be located on a portion of the lower electrode 290 disposed on the third insulating layer 270. The light emitting layer of first sub-pixel 315 may be disposed in the first opening on the lower electrode 290. In addition, the second opening of the pixel defining layer 310 may be located in the transparent region II. The second opening may be the transparent window 395. The pixel defining layer 310 may include at least one of organic materials and inorganic materials. In an exemplary embodiment, the transparent window 395 may be formed by removing a portion of the first insulating layer 150, a portion of the second insulating layer 190, a portion of the third insulating layer 270, and a portion of the pixel defining layer 310. In an exemplary embodiment, portions of the insulating layers, 150, 190, and 270 may not be located in the transparent region II. In other words, the insulating layers 150, 190, and 270 may expose the transparent region II. When the insulating layers are not located in the second opening, the OLED device may result in a substantially increased transmissivity of the transparent region II. In an alternate embodiment, at least one insulating layer may be located in the entire transparent region II.

The upper electrode 355 may be disposed on the pixel defining layer 310 and light emitting layer of first sub-pixel 315 in the pixel region I. The upper electrode 355 may not be located in the transparent region II. In other words, the upper electrode 355 may expose the transparent region II. The upper electrode 355 may be relatively thick. A thickness of the upper electrode 355 may be over about 100 Å (angstrom). For example, a light transmissivity of the upper electrode 355 may be below about 50%. The upper electrode 355 may include at least one of metal, metal alloy, metal nitride, conductive metal oxide, and a transparent conductive material. The upper electrode 355 may also include any other suitable material. In an exemplary embodiment, the upper electrode 355 may include Mg—Ag alloy.

The auxiliary electrode 365 may be disposed on a portion of the pixel defining layer 310 and a portion of the substrate 110. In other words, the auxiliary electrode 365 may be entirely located on the substrate 110 in the pixel region I and the transparent region II. Compared to the upper electrode 355, the auxiliary electrode 365 may be relatively thin. A thickness of the auxiliary electrode 365 may be below about 75 Å (angstrom). For example, a light transmissivity of the auxiliary electrode 365 may be over about 50%. The auxiliary electrode 365 may include at least one of metal, metal alloy, metal nitride, conductive metal oxide, and a transparent conductive material. The auxiliary electrode 365 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide ($SnO_x$), indium oxide ($InO_x$), gallium oxide ($GaO_x$), gallium zinc oxide (GZO), and indium zinc oxide (IZO). The auxiliary electrode 365 may include any other suitable material.

Because the OLED device has the auxiliary electrode 365 that is entirely disposed on the substrate 110 in the pixel region I and the transparent region II, the OLED device may have a reduction in the generation of an IR drop. In addition, because the auxiliary electrode 365 is relatively thin and is located in the transparent region II, the OLED device may not suffer from a significant decrease in the transmissivity of the OLED device.

Figure 9:
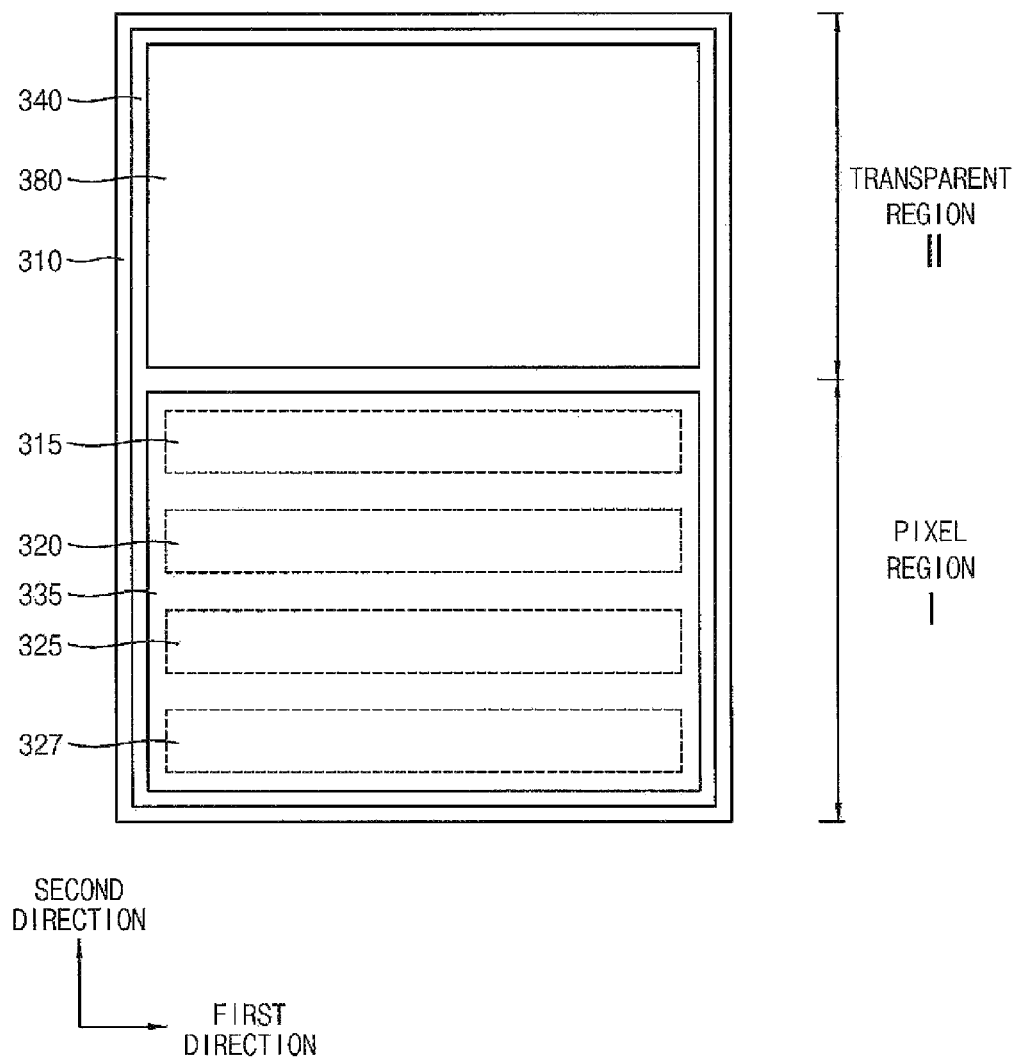
FIG. 9 is a plan view illustrating an organic light emitting display device according to an exemplary embodiment.

FIG. 9 is a plan view illustrating an organic light emitting display device according to an exemplary embodiment. An organic light emitting display device illustrated in FIG. 9 may have a configuration substantially similar to an organic light emitting display device 300 described with reference to FIG. 4 except for a fourth sub-pixel. In FIG. 9, detailed descriptions for elements that are substantially similar to the elements described with reference to FIG. 4 will be omitted for brevity.

Referring to FIG. 9, an organic light emitting display (OLED) device may include a pixel region I and a transparent region II. A first sub-pixel 315, a second sub-pixel 320, a third sub-pixel 325, and a fourth sub-pixel 327 may be located in a pixel region I. A transparent window 380 may be located in the transparent region II. In addition, an auxiliary electrode 340 may be entirely located on the substrate 110 in the pixel region I and the transparent region II. In an exemplary embodiment, the first sub-pixel 315 may be a pixel emitting a red color and may extend along a first direction. The second sub-pixel 320 may be a pixel emitting a green color and may be disposed substantially parallel to the first sub-pixel 315. The third sub-pixel 325 may be a pixel emitting a blue color and may be disposed substantially parallel to the first sub-pixel 315 and the second sub-pixel 320. The fourth sub-pixel 327 may be a pixel emitting a white color and may be disposed substantially parallel to the first, second, and third sub-pixels 315, 320, and 325. The first, second, third, and fourth sub-pixels 315, 320, 325, and 327 may be located at the same level on a substrate. In particular, the first, second, third, and fourth sub-pixels 315, 320, 325, and 327 may extend along the first direction because the first, second, third, and fourth sub-pixels 315, 320, 325, and 327 are manufactured through an SMS method. The transparent window 380 may transmit an external light in the transparent region II. Here, common lines and insulating layers may be disposed in a portion that surrounds the first, second, third, and fourth sub-pixels 315, 320, 325, and 327 and the transparent window 380. For example, a pixel defining layer 310 may surround the first, second, third, and fourth sub-pixels 315, 320, 325, and 327 and the transparent window 380. In an exemplary embodiment, the upper electrode 335 may be disposed on the first, second, third, and fourth sub-pixels 315, 320, 325, and 327 in the pixel region I and may extend along the first direction. Here, the upper electrode 335 may not be located in the transparent region II. In other words, the upper electrode 335 may expose the transparent region II. In addition, the auxiliary electrode 340 may be disposed between the upper electrode 335 and the first, second, third, and fourth sub-pixels 315, 320, 325, and 327 and may extend along the first direction and second direction. In other words, the auxiliary electrode 340 may be located in the pixel region I and the transparent region II. In an alternate embodiment, the auxiliary electrode 340 may be disposed directly on the upper electrode 335 (instead of between the upper electrode 335 and the first, second, third, and fourth sub-pixels 315, 320, 325, and 327) and may extend along the first direction and the second direction.

FIGS. 10A, 10B, 10C, 10D, 10E, and 10F are cross sectional views illustrating a method of manufacturing an organic light emitting display device according to an exemplary embodiment.

Figure 10A:
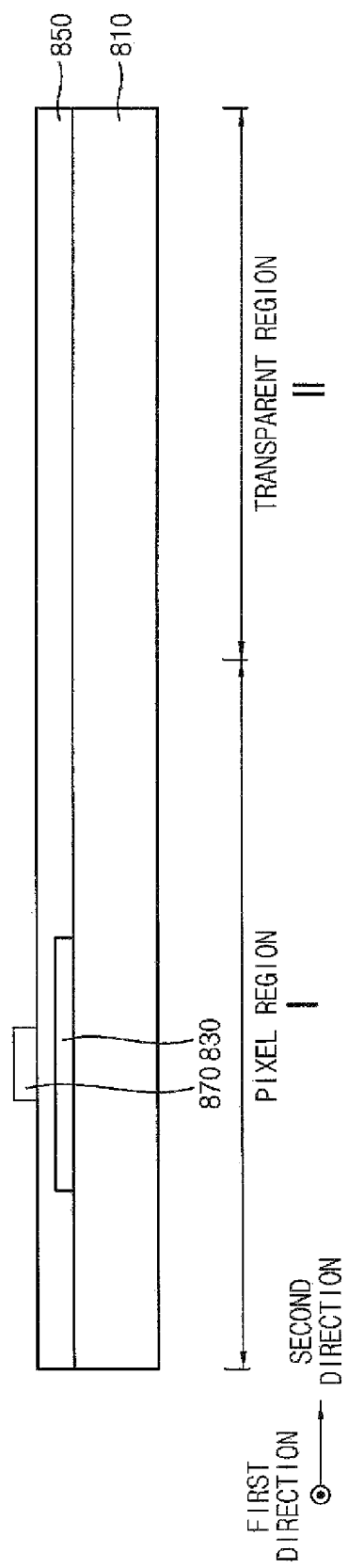
Figure 10C:
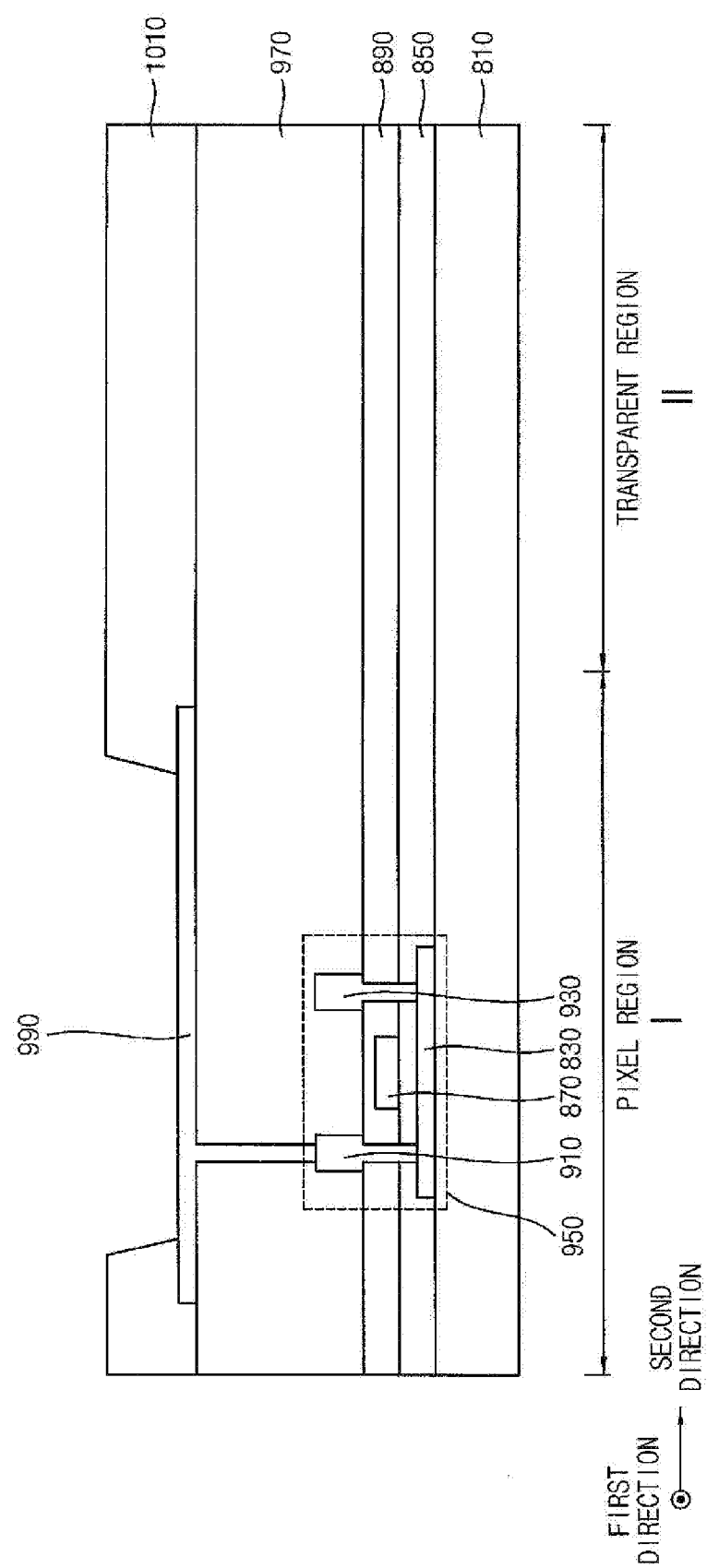

Referring to FIG. 10A, an active layer 830 may be formed in a pixel region I of a substrate 810. The substrate 810 may be formed using at least one of quartz, synthetic quartz, calcium fluoride, fluoride-doping quartz, a soda lime glass, and a non-alkali glass. The substrate 810 may also be formed using any other suitable material. In an alternate embodiment, a buffer layer may be formed on the substrate 810. The buffer layer may be entirely formed from the pixel region I into the transparent region II and may cover the entire pixel region I and transparent region II. The buffer layer may prevent the diffusion of metal atoms and/or impurities from the substrate 810 into other layers and components of the OLED device (e.g., the active layer 830). The active layer 830 may be formed on the substrate 810 in the pixel region I. The active layer 830 may be formed using at least one of an oxide semiconductor, an inorganic semiconductor, and an organic semiconductor. The active layer 830 may include any other suitable material. A first insulating layer 850 may be formed on the substrate 810. The first insulating layer 850 may cover the active layer 830 and may extend into the transparent region II. The first insulating layer 850 may be entirely formed on the substrate 810 in the pixel region I and the transparent region II. The first insulating layer 850 may be formed using at least one of a silicon compound and a metal oxide. A gate electrode 870 may be formed on the first insulating layer 850 over the active layer 830, which is located under the first insulating layer 850. The gate electrode 870 may be formed using at least one of metal, metal alloy, metal nitride, conductive metal oxide, and transparent conductive materials. The gate electrode 870 may also be any other suitable material.

Referring to FIG. 10B, a second insulating layer 890 may be formed on the gate electrode 870. The second insulating layer 890 may cover the gate electrode 870 and may extend from the transparent region II. The second insulating layer 890 may be entirely formed on the substrate 810 in the pixel region I and the transparent region II. The second insulating layer 890 may be formed using at least one of a silicon compound and a metal oxide. The second insulating layer 890 may be form of any other suitable material. A source electrode 910 and a drain electrode 930 may be formed on the second insulating layer 890. The source electrode 910 may contact a first side of the active layer 830 by removing a first portion of the first and second insulating layers 850 and 890 and the drain electrode 930 may contact a second side of the active layer 830 by removing a second portion of the first and second insulating layers 850 and 890. Each of the source electrode 910 and the drain electrode 930 may be formed using at least one of metal, metal alloy, metal nitride, conductive metal oxide, and transparent conductive materials. Each of the source electrode 910 and the drain electrode 930 may be formed using any other suitable material. As described, a driving transistor 950 having the source electrode 910, the drain electrode 930, the gate electrode 870, and the active layer 830 may be formed.

Referring to FIG. 10O, a third insulating layer 970 may be formed on the source electrode 910 and the drain electrode 930. The third insulating layer 970 may cover the source electrode 910 and the drain electrode 930 in the pixel region I, and may extend into the transparent region II. Thus, the third insulating layer 970 may be entirely formed in the pixel region I and the transparent region II of the substrate 810. A lower electrode 990 may be formed on a third insulating layer 970. The lower electrode 990 may contact the source electrode 910 by removing a portion of the third insulating layer 970. The lower electrode 990 may be formed using at least one of metal, metal alloy, metal nitride, conductive metal oxide, and transparent conductive materials. The lower electrode 990 may be formed using any other suitable material.

The pixel defining layer 1010 may be formed on a portion of third insulating layer 970 and a portion of the lower electrode 990. The pixel defining layer 1010 may include a first opening. The first opening of the pixel defining layer 1010 may be in the pixel region I exposing a portion of the lower electrode 990, and the pixel defining layer 1010 is formed on the third insulating layer 970 and a portion of the lower electrode 990. The pixel defining layer 1010 may be formed using at least one of organic materials and inorganic materials.

Referring to FIG. 10D, a light emitting layer 1015 may be formed in the first opening of the pixel defining layer 1010. The light emitting layer 1015 may be formed on the lower electrode 990. The light emitting layer 1015 may be formed using at least one of light emitting materials capable of generating different colors of light. For example, the light emitting layer 1015 may be formed through an SMS method. Thus, the light emitting layer 1015 may extend along the first direction. An auxiliary electrode 1080 may be formed on the pixel defining layer 1010 and light emitting layer 1015. The auxiliary electrode 1080 may cover the pixel defining layer 1010 and the light emitting layer 1015 and extend along the first direction and a second direction (e.g., a direction from the pixel region I into the transparent region II) that is substantially perpendicular to the first direction.

The auxiliary electrode 1080 may be formed through the SMS method. Because the auxiliary electrode 1080 is formed through the SMS method, the auxiliary electrode 1080 may be formed in the same chamber as the light emitting layer 1015 but may be formed after the light emitting layer 1015. Accordingly, manufacturing cost and time may be relatively reduced.

The auxiliary electrode 1080 may be relatively thin. For example, a thickness of the auxiliary electrode 1080 may be formed below about 75 Å (angstrom). A light transmissivity of the auxiliary electrode 1080 may be over about 50%. The auxiliary electrode 1080 may be entirely formed in the pixel region I and the transparent region II. The auxiliary electrode 1080 may include at least one of metal, metal alloy, metal nitride, conductive metal oxide, and a transparent conductive material. For example, the auxiliary electrode 1080 may be formed using at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide ($SnO_x$), indium oxide ($InO_x$), gallium oxide ($GaO_x$), gallium zinc oxide (GZO), and indium zinc oxide (IZO). The auxiliary electrode 1080 may be formed using any other suitable material.

Referring to FIG. 10E, the upper electrode 1075 may be formed on the auxiliary electrode 1080 in the pixel region I. Here, the upper electrode 1075 may electrically contact the auxiliary electrode 1080. The upper electrode 1075 may not be located in the transparent region II. Thus, the upper electrode 1075 may expose the transparent region II. The upper electrode 1075 may cover a portion of the auxiliary electrode 1080. The upper electrode 1075 may be formed through an FMM method. Because the upper electrode 1075 is formed through the FMM method, the upper electrode 1075 may be formed using a different chamber than the auxiliary electrode 1080 and may be formed after the auxiliary electrode 1080.

Compared to the auxiliary electrode 1080, the upper electrode 1075 may be relatively thick. For example, a thickness of the upper electrode 1075 may be formed over about 100 Å (angstrom). A light transmissivity of the upper electrode 1075 may be below about 50%. The upper electrode 1075 may be formed using at least one of metal, metal alloy, metal nitride, conductive metal oxide, and a transparent conductive material. The upper electrode 1075 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, magnesium (Mg), magnesium alloy, magnesium-silver (Mg—Ag) alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), aluminum zinc oxide (AZO), indium tin oxide (ITO), stannum oxide ($SnO_x$), indium oxide ($InO_x$), gallium oxide ($GaO_x$), gallium zinc oxide (GZO), and indium zinc oxide (IZO). The upper electrode 1075 may be formed using any other suitable material. In an exemplary embodiment, the upper electrode 1075 may be formed using Mg—Ag alloy.

Referring to FIG. 10F, a second opening of the pixel defining layer 1010 may be located in the transparent region II. The second opening may be the transparent window 1070. In an exemplary embodiment, the transparent window 1070 may be formed by removing a portion of the auxiliary electrode 1080, a portion of the first insulating layer 850, a portion of the second insulating layer 890, a portion of the third insulating layer 970, and a portion of the pixel defining layer 1010. An encapsulation substrate 1050 may be formed on the upper electrode 1075, the auxiliary electrode 1080, and the transparent window 1070. The encapsulation substrate 1050 and the substrate 810 may include substantially the same materials. For example, the encapsulation substrate 1050 and the substrate 810 may be formed using at least one of quartz, synthetic quartz, calcium fluoride, fluoride-doping quartz, soda lime glass, and non-alkali glass. The encapsulation substrate 1050 and the substrate 810 may be formed using any other suitable material.

Figure 11:
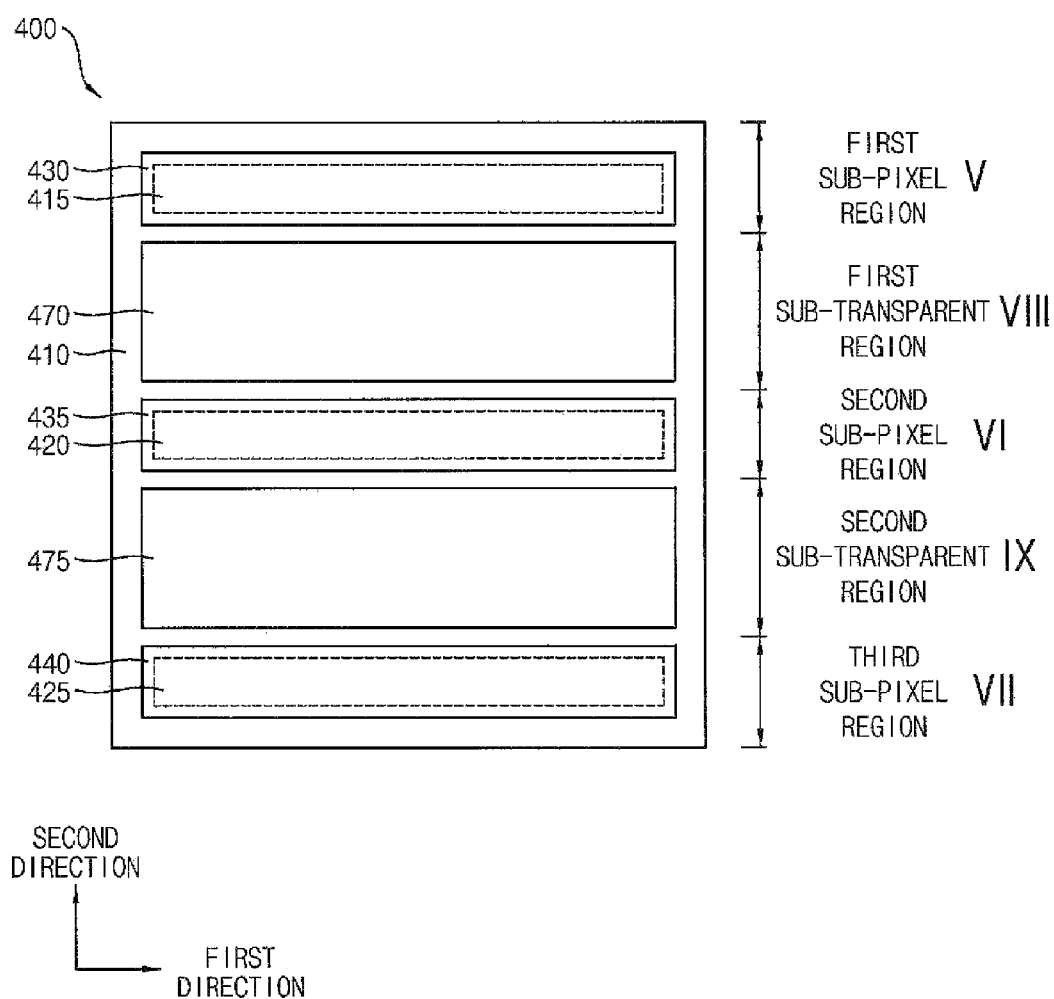
FIG. 11 is a plan view illustrating an organic light emitting display device according to an exemplary embodiment.

FIG. 11 is a plan view illustrating an organic light emitting display device according to an exemplary embodiment. An organic light emitting display device 400 illustrated in FIG. 11 may have a configuration substantially similar to organic light emitting display device 100 described with reference to FIG. 1. In FIG. 11, detailed descriptions for elements that are substantially similar to the elements described with reference to FIG. 1 will be omitted for brevity.

Referring to FIG. 11, an organic light emitting display (OLED) device 400 may include a pixel region I and a transparent region II. The pixel region I may be a non-uniform by having separate sub-pixel regions. Similarly, the transparent region II may be non-uniform by having separate sub-transparent regions. In an exemplary embodiment, the sub-pixel regions of pixel region I may be separated from one another by sub-transparent regions of the transparent region II and vice versa. The pixel region I may include a first sub-pixel region V, a second sub-pixel region VI, and a third sub-pixel region VII. The transparent region II may include a first sub-transparent region VIII and a second sub-transparent region IX. A first sub-pixel 415, a second sub-pixel 420, and a third sub-pixel 425 may be located in the first, second, and third sub-pixel regions V, VI, and VII, respectively. The first transparent window 470 and the second transparent 475 may be located in the first and second sub-transparent regions VIII and IX, respectively. In an exemplary embodiment, the first sub-pixel 415 may be a pixel emitting a red color and may extend along a first direction. The second sub-pixel 420 may be a pixel emitting a green color and may be disposed substantially parallel to the first sub-pixel 415. The third sub-pixel 425 may be a pixel emitting a blue color and may be disposed substantially parallel to the first sub-pixel 415 and the second sub-pixel 420. The first, second, and third sub-pixels 415, 420, and 425 may be located at the same level on a substrate. In particular, the first, second, and third sub-pixels 415, 420, and 425 may extend along the first direction because the first, second, and third sub-pixels 415, 420, and 425 are manufactured through an SMS method. The first and second transparent windows 470 and 475 may transmit an external light in the transparent region II (i.e., first sub-transparent region VIII and second sub-transparent region IX, respectively). Here, common lines and insulating layers may be disposed in a portion that surrounds the first, second, and third sub-pixels 415, 420, and 425 and the first and second transparent windows 470 and 475. For example, a pixel defining layer 410 may surround the first, second, and third sub-pixels 415, 420, and 425 and the first and second transparent windows 470 and 475.

In an exemplary embodiment, the OLED device 400 may include a plurality of upper electrodes 430, 435, and 440. In an exemplary embodiment, the upper electrode 430 may be disposed on the first sub-pixel 415 in the first sub-pixel region V and may extend along the first direction. The upper electrode 435 may be disposed on the second sub-pixel 420 in the second sub-pixel region VI and may extend along the first direction. The upper electrode 440 may be disposed on the third sub-pixel 425 in the third sub-pixel region VII and may extend along the first direction. Here, the upper electrodes 430, 435, and 440 may not be located in the first and second sub-transparent regions VIII and IX. Thus, the upper electrodes 430, 435, and 440 may expose the first and second sub-transparent regions VIII and IX. In addition, the first sub-transparent region VIII may be located between the first sub-pixel region V and the second sub-pixel region VI. Thus, the first transparent window 470 may be interposed between the first sub-pixel 415 and the second sub-pixel 420. In a similar manner, the second sub-transparent region IX may be located between the second sub-pixel region VI and the third sub-pixel region VII. Thus, the second transparent window 475 may be interposed between the second sub-pixel 420 and the third sub-pixel 425.

Figure 12:
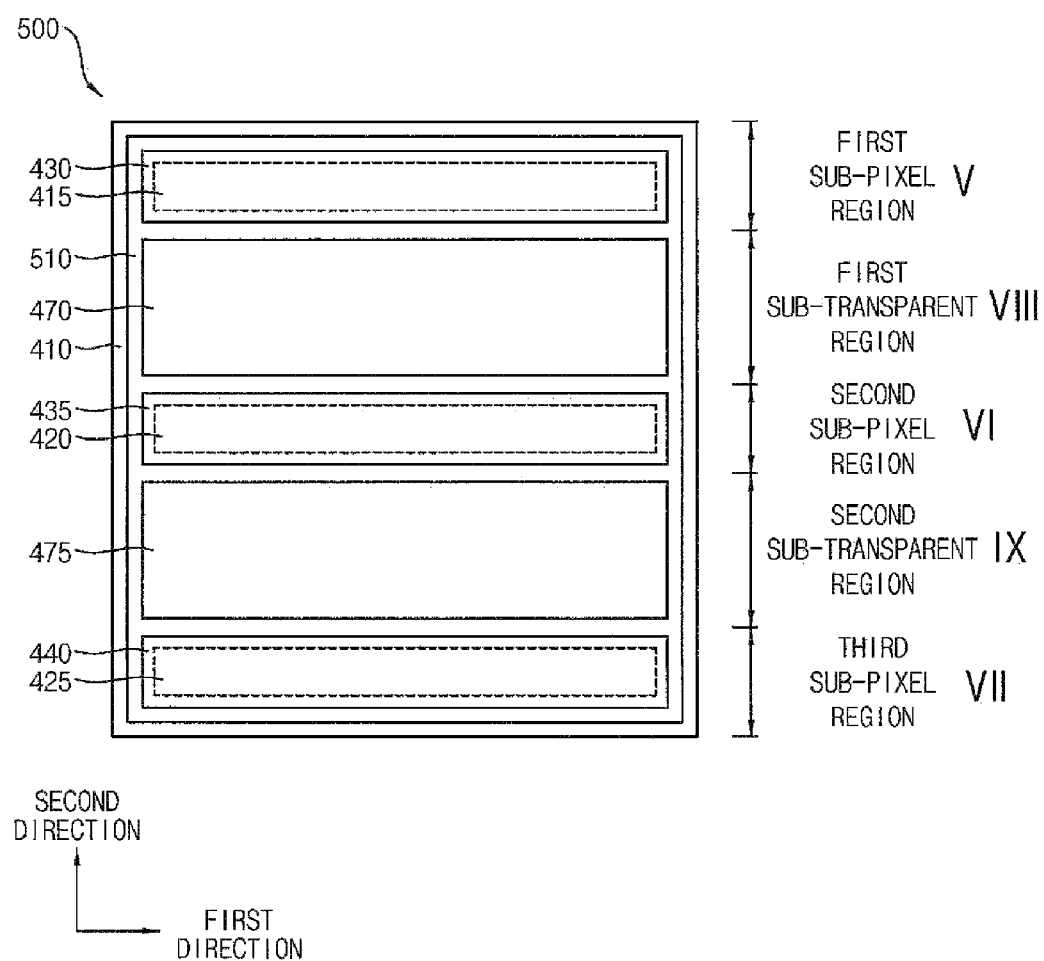
FIG. 12 is a plan view illustrating an organic light emitting display device according to an exemplary embodiment.

FIG. 12 is a plan view illustrating an organic light emitting display device according to an exemplary embodiment. An organic light emitting display device 500 illustrated in FIG. 12 may have a configuration substantially similar to organic light emitting display device 400 described with reference to FIG. 11 except for an auxiliary electrode 510. In FIG. 12, detailed descriptions for elements that are substantially similar to the elements described with reference to FIG. 11 will be omitted for brevity.

Referring to FIG. 12, an organic light emitting display (OLED) device 500 may include a pixel region I and a transparent region II. The pixel region I may be non-uniform by having separate sub-pixel regions. Similarly, the transparent region II may be non-uniform by having separate sub-transparent regions. In an exemplary embodiment, the sub-pixel regions of pixel region I may be separated from one another by sub-transparent regions of the transparent region II and vice versa. The pixel region I may include a first sub-pixel region V, a second sub-pixel region VI, and a third sub-pixel region VII. The transparent region II may include a first sub-transparent region VIII and a second sub-transparent region IX. A first sub-pixel 415, a second sub-pixel 420, and a third sub-pixel 425 may be located in the first, second, and third sub-pixel regions V, VI, and VII, respectively. A first transparent window 470 and a second transparent window 475 may be located in the first and second sub-transparent regions VIII and IX, respectively. In an exemplary embodiment, the first sub-pixel 415 may be a pixel emitting a red color and may extend along a first direction. The second sub-pixel 420 may be a pixel emitting a green color and may be disposed substantially parallel to the first sub-pixel 415. The third sub-pixel 425 may be a pixel emitting a blue color and may be disposed in substantially parallel to the first sub-pixel 415 and the second sub-pixel 420. The first, second, and third sub-pixels 415, 420, and 425 may be located at the same level on a substrate. In particular, the first, second, and third sub-pixels 415, 420, and 425 may extend along the first direction because the first, second, and third sub-pixels 415, 420, and 425 are manufactured through an SMS method. The first and second transparent windows 470 and 475 may transmit an external light in the transparent region II. Here, common lines and insulating layers may be disposed in a portion that surrounds the first, second, and third sub-pixels 415, 420, and 425 and the first and second transparent windows 470 and 475. For example, a pixel defining layer 410 may surround the first, second, and third sub-pixels 415, 420, and 425 and the first and second transparent windows 470 and 475.

In an exemplary embodiment, the OLED device 500 may include a plurality of upper electrodes 430, 435, and 440. For example, the upper electrode 430 may be disposed on the first sub-pixel 415 in the first sub-pixel region V and may extend along the first direction. The upper electrode 435 may be disposed on the second sub-pixel 420 in the second sub-pixel region VI and may extend along the first direction. The upper electrode 440 may be disposed on the third sub-pixel 425 in the third sub-pixel region VII and may extend along the first direction. Here, the upper electrodes 430, 435, and 440 may not be located in the first and second sub-transparent regions VIII and IX. Thus, the upper electrodes 430, 435, and 440 may expose the first and second sub-transparent regions VIII and IX. In addition, the first sub-transparent region VIII may be located between the first sub-pixel region V and the second sub-pixel region VI. Thus, the first transparent window 470 may be interposed between the first sub-pixel 415 and the second sub-pixel 420. In a similar manner, the second sub-transparent region IX may be located between the second sub-pixel region VI and the third sub-pixel region VII. Thus, the second transparent window 475 may be interposed between the second sub-pixel 420 and the third sub-pixel 425. Furthermore, an auxiliary electrode 510 may be interposed between the upper electrodes 430, 435, and 440 and the first, second, and third sub-pixels 415, 420, and 425. The auxiliary electrode 510 may extend along the first direction and the second direction. Thus, the auxiliary electrode 510 may be located in the transparent region II as well as the pixel region I. In an exemplary embodiment, because the first, second, and third sub-pixels 415, 420, and 425 and the auxiliary electrode 510 are disposed through the SMS method, the auxiliary electrode 510 may be disposed in the same chamber as the first, second, and third sub-pixels 415, 420, and 425 but are disposed after the first, second, and third sub-pixels 415, 420, and 425. Then, the upper electrodes 430, 435, and 440 may be disposed through the FMM method. In an alternate embodiment, the auxiliary electrode 510 may be disposed on the upper electrodes 430, 435, and 440.

FIG. 13 is a plan view illustrating an organic light emitting display device according to an exemplary embodiment. An organic light emitting display device 600 illustrated in FIG. 13 may have a configuration substantially similar to organic light emitting display device 300 described with reference to FIG. 4. In FIG. 13, detailed descriptions for elements that are substantially similar to the elements described with reference to FIG. 4 will be omitted for brevity.

Referring to FIG. 13, an organic light emitting display (OLED) device 600 may include a plurality of pixel regions I and a plurality of transparent regions II. A first sub-pixel 615, a second sub-pixel 620, and a third sub-pixel 625 may be located in the plurality of pixel regions I. Transparent windows 670 may be located in the plurality of transparent regions II. The pixel regions I and the transparent regions II may be repeatedly arranged in a first direction and alternately arranged in a second direction. For example, one pixel region I or one transparent region II may be repeatedly arranged in a first direction. The repeatedly arranged pixel regions I and the repeatedly arranged transparent regions II may be alternately arranged in the second direction that is substantially perpendicular to the first direction. In an exemplary embodiment, an auxiliary electrode 640 may be entirely located on the substrate in the pixel regions I and the transparent regions II.

In an exemplary embodiment, the first sub-pixel 615 may be a pixel emitting a red color and may extend along a first direction. The second sub-pixel 620 may be a pixel emitting a green color and may be disposed in substantially parallel to the first sub-pixel 615. The third sub-pixel 625 may be a pixel emitting a blue color and may be disposed in substantially parallel to the first sub-pixel 615 and the second sub-pixel 620. The first, second, and third sub-pixels 615, 620, and 625 may be located at the same level on a substrate. In particular, the first, second, and third sub-pixels 615, 620, and 625 may extend along the first direction because the first, second, and third sub-pixels 615, 620, and 625 are manufactured through an SMS method.

In an exemplary embodiment, the transparent windows 670 may transmit an external light. Here, common lines and insulating layers may be disposed in a portion that surrounds the first, second, and third sub-pixels 615, 620, and 625 and the transparent windows 670. For example, a pixel defining layer 610 may surround the first, second, and third sub-pixels 615, 620, and 625 and the transparent windows 670. In an exemplary embodiment, an upper electrode 630 may be disposed on the first, second, and third sub-pixels 615, 620, and 625 in the pixel region I and may extend along the first direction. Here, the upper electrode 630 may not be located in the transparent region II. Thus, the upper electrode 630 may expose the transparent regions II. In addition, the auxiliary electrode 640 may be interposed between the upper electrode 630 and the first, second, and third sub-pixels 615, 620, and 625 and may be entirely disposed on the pixel defining layer 610. Thus, the auxiliary electrode 640 may be located in the transparent region II as well as the pixel region I. In an exemplary embodiment, because the first, second, and third sub-pixels 615, 620, and 625 and the auxiliary electrode 640 are disposed through the SMS method, the auxiliary electrode 640 may be disposed in the same chamber as the first, second, and third sub-pixels 615, 620, and 625 but after the first, second, and third sub-pixels 615, 620, and 625. Then, an upper electrode 630 may be disposed through an FMM method.

FIG. 14 is a plan view illustrating an organic light emitting display device according to an exemplary embodiment.

An organic light emitting display device 700 illustrated in FIG. 14 may have a configuration substantially similar to organic light emitting display device 300 described with reference to FIG. 4. In FIG. 14, detailed descriptions for elements that are substantially similar to elements described with reference to FIG. 4 will be omitted for brevity.

Referring to FIG. 14, an organic light emitting display (OLED) device 700 may include a plurality of pixel regions I and a plurality of transparent regions II. A first sub-pixel 715, a second sub-pixel 720, and a third sub-pixel 725 may be located in the pixel regions I. Transparent windows 770 may be located in the transparent regions II. At least two pixel regions I and at least two transparent regions II may be repeatedly arranged in a first direction and alternately arranged in a second direction. For example, the at least two adjacent pixel regions I in the second direction and the at least two adjacent transparent regions II in the second direction may be repeatedly arranged in a first direction. The repeatedly arranged pixel regions I in the first direction and the repeatedly arranged transparent regions II in the first direction may be alternately arranged in the second direction in pairs. In other words, two pixel regions I are adjacent to each other in the second direction forming a pixel region I pair and two transparent regions II are also adjacent to each other in the second direction forming a transparent region II pair. The pixel region I pair is alternately arranged with the transparent region II pair in the second direction. In an embodiment the first direction is substantially perpendicular to the second direction.

In an exemplary embodiment, an auxiliary electrode 740 may be entirely located on the substrate in the pixel regions I and the transparent regions II of the OLED device 700. The first sub-pixel 715 may be a pixel emitting a red color and may extend along a first direction. The second sub-pixel 720 may be a pixel emitting a green color and may be disposed substantially parallel to the first sub-pixel 715. The third sub-pixel 725 may be a pixel emitting a blue color and may be disposed substantially parallel to the first sub-pixel 715 and the second sub-pixel 720. The first, second, and third sub-pixels 715, 720, and 725 may be located at the same level on a substrate. In particular, the first, second, and third sub-pixels 715, 720, and 725 may extend along the first direction because the first, second, and third sub-pixels 715, 720, and 725 are manufactured through an SMS method. The transparent windows 770 may transmit an external light. Here, common lines and insulating layers may be disposed in a portion that surrounds the first, second, and third sub-pixels 715, 720, and 725 and the transparent windows 770. For example, a pixel defining layer 710 may surround the first, second, and third sub-pixels 715, 720, and 725 and the transparent windows 770. In an exemplary embodiment, an upper electrode 730 may be disposed on the first, second, and third sub-pixels 715, 720, and 725 in the pixel region I and may extend along the first direction. The upper electrode 730 may extend across two adjacent pixel regions I. Here, the upper electrode 730 may not be located in a transparent region II. Thus, the upper electrode 730 may expose a transparent region II. In addition, the auxiliary electrode 740 may be interposed between the upper electrode 730 and the first, second, and third sub-pixels 715, 720, and 725 and may be entirely disposed on the pixel defining layer 710. Thus, the auxiliary electrode 740 may be located in the pixel regions I and transparent regions II. In an exemplary embodiment, because the first, second, and third sub-pixels 715, 720, and 725 and the auxiliary electrode 740 are disposed through the SMS method, the auxiliary electrode 740 may be disposed in the same chamber as the first, second, and third sub-pixels 715, 720, and 725 but after the first, second, and third sub-pixels 715, 720, and 725. Then, an upper electrode 730 may be disposed through an FMM method.

An organic light emitting display device according to an exemplary embodiment includes a relatively thick upper electrode in a pixel region resulting in an increased definition of an image of an object transmitted through a transparent region. In addition, because an organic light emitting display device has an auxiliary electrode, the organic light emitting display device may have a reduced IR drop phenomenon compared to organic light emitting display devices without an auxiliary electrode.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display device, comprising:
a substrate comprising a pixel region having a plurality of pixels and a transparent region that is located adjacent to the pixel region;
an insulating layer disposed on the substrate in the pixel region and the transparent region;
a lower electrode disposed on the insulating layer in the pixel region, the lower electrode extending along a first direction;
a pixel defining layer disposed on the insulating layer, the pixel defining layer having a first opening that exposes a portion of the lower electrode in the pixel region and a second opening that exposes the insulating layer in the transparent region;
a light emitting layer disposed on the lower electrode, the light emitting layer extending along the first direction;
an upper electrode disposed on the light emitting layer in the pixel region, the upper electrode extending along the first direction; and
an auxiliary electrode disposed on the upper electrode to overlap the pixel region,
wherein the upper electrode exposes the transparent region,
wherein a thickness of the upper electrode is greater than a thickness of the auxiliary electrode, and
wherein the auxiliary electrode and the pixel defining layer directly expose an upper surface of the insulating layer in the transparent region.

2. The organic light emitting display device of claim 1, wherein the auxiliary electrode extends from the pixel region into the transparent region along a second direction that is substantially perpendicular to the first direction.

3. The organic light emitting display device of claim 1, wherein the auxiliary electrode is disposed in the pixel region and the auxiliary electrode exposes the transparent region.

4. The organic light emitting display device of claim 1, wherein the upper electrode and the auxiliary electrode are electrically connected.

5. The organic light emitting display device of claim 1, wherein the pixel region comprises:
a first sub-pixel region extending along the first direction, the first sub-pixel region comprising red sub-pixels;
a second sub-pixel region located at the same level with the red sub-pixel, the second sub pixel region comprising green sub-pixels; and
a third sub-pixel region located at the same level with the red and green sub-pixels, the third sub-pixel region comprising blue sub-pixels.

6. The organic light emitting display device of claim 5, wherein the first, second, and third sub-pixel regions are disposed adjacent to each other, and the upper electrode is located in the first, second, and third sub-pixel regions.

7. The organic light emitting display device of claim 5, wherein the transparent region comprises:
a first sub-transparent region located between the first sub-pixel region and the second sub pixel-region; and
a second sub-transparent region located between the second sub-pixel region and the third sub-pixel region,
wherein the upper electrode exposes the first and second sub-transparent regions.

8. The organic light emitting display device of claim 5, further comprising:
a fourth sub-pixel region located at the same level with the red, green and blue sub-pixels, the fourth sub-pixel comprising a white sub-pixel.

9. The organic light emitting display device of claim 1, wherein the
pixel defining layer surrounds the light emitting layer.

10. The organic light emitting display device of claim 1, wherein the pixel region and the transparent region are repeatedly arranged in the first direction, and the repeatedly arranged pixel regions and the repeatedly arranged transparent regions are alternately arranged in a second direction that is substantially perpendicular to the first direction.

11. The organic light emitting display device of claim 1, wherein:
two pixel regions are adjacent to one another in a second direction that is perpendicular to the first direction,
two transparent regions are adjacent to one another in the second direction, and
the two adjacent pixel regions and the two adjacent transparent regions are repeatedly arranged in the first direction.

12. The organic light emitting display device of claim 1, wherein:
two pixel regions are adjacent to one another in a second direction that is perpendicular to the first direction forming a pixel region pair,
two transparent regions are adjacent to one another in the second direction forming a transparent region pair, and
the pixel region pair and the transparent region pair are alternately arranged in the second direction.

13. The organic light emitting display device of claim 1, wherein the light emitting layer is obtained through a small mask scanning (SMS) method.

14. The organic light emitting display device of claim 1, wherein the auxiliary electrode comprises at least one of a metal, a metal alloy, a metal nitride, a conductive metal oxide, and a transparent conductive material.

15. An organic light emitting display device, comprising:
a substrate comprising a pixel region having a plurality of pixels and a transparent region that is located adjacent to the pixel region;
an insulating layer disposed on the substrate;
a lower electrode disposed on the insulating layer in the pixel region, the lower electrode extending along a first direction;
a pixel defining layer disposed on the insulating layer and surrounding the light emitting layer;
a light emitting layer disposed on the lower electrode, the light emitting layer extending along the first direction;
an upper electrode disposed on the light emitting layer in the pixel region, the upper electrode extending along the first direction; and
an auxiliary electrode disposed between the pixel defining layer and the upper electrode,
wherein the upper electrode exposes the transparent region.

16. The organic light emitting display device of claim 15, wherein the auxiliary electrode is disposed on the light emitting layer.

17. The organic light emitting display device of claim 16, wherein the upper electrode and the auxiliary electrode are electrically connected, and a thickness of the upper electrode is greater than a thickness of the auxiliary electrode.

18. An organic light emitting display device, comprising:
- a substrate comprising a pixel region having a plurality of pixels and a transparent region that is located adjacent to the pixel region;
- an insulating layer disposed on the substrate, the insulating layer exposing a portion of the substrate in the transparent region;
- a lower electrode disposed on the insulating layer in the pixel region, the lower electrode extending along a first direction;
- a pixel defining layer disposed on the insulating layer, the pixel defining layer having a first opening that exposes a portion of the lower electrode in the pixel region and a second opening that exposes a portion of the substrate in the transparent region;
- a light emitting layer disposed on the lower electrode, the light emitting layer extending along the first direction;
- an upper electrode disposed on the light emitting layer in the pixel region, the upper electrode extending along the first direction; and
- an auxiliary electrode disposed on the upper electrode to overlap the pixel region,
- wherein the upper electrode exposes the transparent region,
- wherein a thickness of the upper electrode is greater than a thickness of the auxiliary electrode, and
- wherein the auxiliary electrode is disposed directly on the substrate in the transparent region.

* * * * *